United States Patent
Hwu et al.

(10) Patent No.: US 10,978,461 B2
(45) Date of Patent: Apr. 13, 2021

(54) ANTIFUSE ARRAY AND METHOD OF FORMING ANTIFUSE USING ANODIC OXIDATION

(71) Applicants: Taiwan Semiconductor Manufacturing Company, Ltd, Hsinchu (TW); National Taiwan University, Taipei (TW)

(72) Inventors: Jenn-Gwo Hwu, Taipei (TW); Wei-Cheng Tian, Taipei (TW); Samuel C. Pan, Hsinchu (TW); Chao-Hsiung Wang, Hsinchu (TW); Chi-Wen Liu, Hsinchu (TW)

(73) Assignees: Taiwan Semiconductor Manufacturing Company Limited, Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 16/656,270

(22) Filed: Oct. 17, 2019

(65) Prior Publication Data

US 2020/0051988 A1 Feb. 13, 2020

Related U.S. Application Data

(60) Continuation of application No. 15/939,485, filed on Mar. 29, 2018, now Pat. No. 10,504,907, which is a (Continued)

(51) Int. Cl.
*H01L 27/112* (2006.01)
*H01L 23/525* (2006.01)
(Continued)

(52) U.S. Cl.
CPC ........ *H01L 27/11206* (2013.01); *B82Y 10/00* (2013.01); *B82Y 40/00* (2013.01);
(Continued)

(58) Field of Classification Search
CPC ......... H01L 27/11206; H01L 21/76888; H01L 21/76838; H01L 21/02258; H01L 29/401;
(Continued)

(56) References Cited

U.S. PATENT DOCUMENTS

| 4,068,018 A | 1/1978 | Hashimoto et al. |
| 4,330,932 A * | 5/1982 | Morris .................. H01L 21/425 148/DIG. 104 |

(Continued)

OTHER PUBLICATIONS

Wire; Academic Press Dictionary of Science and Technology, ed. C. Morris; Elsevier Science 1992.

*Primary Examiner* — Cuong B Nguyen
*Assistant Examiner* — Juanita B Rhodes
(74) *Attorney, Agent, or Firm* — Slater Matsil, LLP

(57) ABSTRACT

A method for forming an antifuse on a substrate is provided, which comprises: forming a first conductive material on the substrate; placing the first conductive material in an electrolytic solution; performing anodic oxidation on the first conductive material to form a nanowire made of the first conductive material and surrounded by a first dielectric material formed during the anodic oxidation and to form the antifuse on the nanowire; and forming a second conductive material on the antifuse to sandwich the antifuse between the first conductive material and the second conductive material.

20 Claims, 33 Drawing Sheets

Related U.S. Application Data division of application No. 14/527,885, filed on Oct. 30, 2014, now Pat. No. 9,953,989, which is a continuation-in-part of application No. 14/315,421, filed on Jun. 26, 2014, now Pat. No. 9,528,194.

(60) Provisional application No. 61/972,462, filed on Mar. 31, 2014.

(51) Int. Cl.

| | | |
|---|---|---|
| *C25D 11/02* | (2006.01) | |
| *B82Y 10/00* | (2011.01) | |
| *B82Y 40/00* | (2011.01) | |
| *H01L 29/40* | (2006.01) | |
| *H01L 29/423* | (2006.01) | |
| *H01L 29/06* | (2006.01) | |
| *H01L 21/768* | (2006.01) | |
| *H01L 21/02* | (2006.01) | |
| *H01L 29/775* | (2006.01) | |

(52) U.S. Cl.
CPC ........ *C25D 11/02* (2013.01); *H01L 21/02258* (2013.01); *H01L 21/76838* (2013.01); *H01L 21/76888* (2013.01); *H01L 23/5252* (2013.01); *H01L 29/0673* (2013.01); *H01L 29/401* (2013.01); *H01L 29/42364* (2013.01); *H01L 29/42372* (2013.01); *H01L 29/42392* (2013.01); *H01L 29/775* (2013.01); *H01L 2221/1094* (2013.01); *H01L 2924/0002* (2013.01)

(58) Field of Classification Search
CPC ......... H01L 29/42364; H01L 29/42372; H01L 29/42392; H01L 29/775; H01L 29/0673; H01L 23/5252; H01L 2221/1094; H01L 2924/0002; C25D 11/02; B82Y 10/00; B82Y 40/00

See application file for complete search history.

(56) References Cited

U.S. PATENT DOCUMENTS

| | | | | |
|---|---|---|---|---|
| 5,134,457 A | * | 7/1992 | Hamdy | H01L 23/5252 257/530 |
| 5,650,338 A | * | 7/1997 | Yamazaki | H01L 27/1214 438/151 |
| 5,660,895 A | | 8/1997 | Lee et al. | |
| 5,867,505 A | | 2/1999 | Beffa | |
| 6,039,857 A | * | 3/2000 | Yeh | C25D 11/32 205/106 |
| 6,285,118 B1 | | 9/2001 | Hatai et al. | |
| 6,399,177 B1 | | 6/2002 | Fonash et al. | |
| 6,613,697 B1 | * | 9/2003 | Faur | C03C 17/25 438/770 |
| 2003/0008473 A1 | | 1/2003 | Sakaguchi et al. | |
| 2003/0173643 A1 | | 9/2003 | Herner | |
| 2004/0033339 A1 | | 2/2004 | Fukutani et al. | |
| 2006/0128071 A1 | | 6/2006 | Rankin et al. | |
| 2006/0216897 A1 | | 9/2006 | Lee et al. | |
| 2007/0032076 A1 | | 2/2007 | Lee et al. | |
| 2007/0069241 A1 | * | 3/2007 | Yang | G11C 17/00 257/209 |
| 2007/0148815 A1 | | 6/2007 | Chao et al. | |
| 2007/0257331 A1 | | 11/2007 | Kurjanowicz et al. | |
| 2008/0009105 A1 | * | 1/2008 | Herner | H01L 23/5252 438/131 |
| 2008/0017934 A1 | | 1/2008 | Kim et al. | |
| 2008/0111210 A1 | * | 5/2008 | Park | H01L 23/5252 257/530 |
| 2008/0135949 A1 | | 6/2008 | Lo et al. | |
| 2008/0211060 A1 | * | 9/2008 | Chang | H01L 23/5252 257/530 |
| 2008/0246158 A1 | * | 10/2008 | Mascolo | H01L 21/76838 257/773 |
| 2009/0036327 A1 | | 2/2009 | Ervin et al. | |
| 2009/0090984 A1 | | 4/2009 | Khan et al. | |
| 2009/0108252 A1 | | 4/2009 | Banerjee et al. | |
| 2010/0041065 A1 | | 2/2010 | Horii et al. | |
| 2010/0187660 A1 | | 7/2010 | Tang et al. | |
| 2011/0039392 A1 | | 2/2011 | Kitajima | |
| 2011/0108887 A1 | | 5/2011 | Fareed et al. | |
| 2011/0213144 A1 | | 9/2011 | Kobayashi et al. | |
| 2011/0284820 A1 | | 11/2011 | Kudera et al. | |
| 2011/0300693 A1 | | 12/2011 | Oh | |
| 2012/0024719 A1 | | 2/2012 | Botte | |
| 2012/0146053 A1 | | 6/2012 | Saitoh et al. | |
| 2012/0228694 A1 | | 9/2012 | Shimizu et al. | |
| 2012/0282743 A1 | | 11/2012 | Saitoh et al. | |
| 2013/0148409 A1 | * | 6/2013 | Chung | H01L 27/2463 365/148 |
| 2013/0161756 A1 | | 6/2013 | Glass et al. | |
| 2014/0197130 A1 | | 7/2014 | Lemke et al. | |
| 2014/0241493 A1 | | 8/2014 | Yokoyama | |
| 2014/0342236 A1 | | 11/2014 | Goyal | |
| 2015/0311286 A1 | | 10/2015 | Lee et al. | |
| 2015/0325481 A1 | | 11/2015 | Radosavljevic et al. | |

* cited by examiner

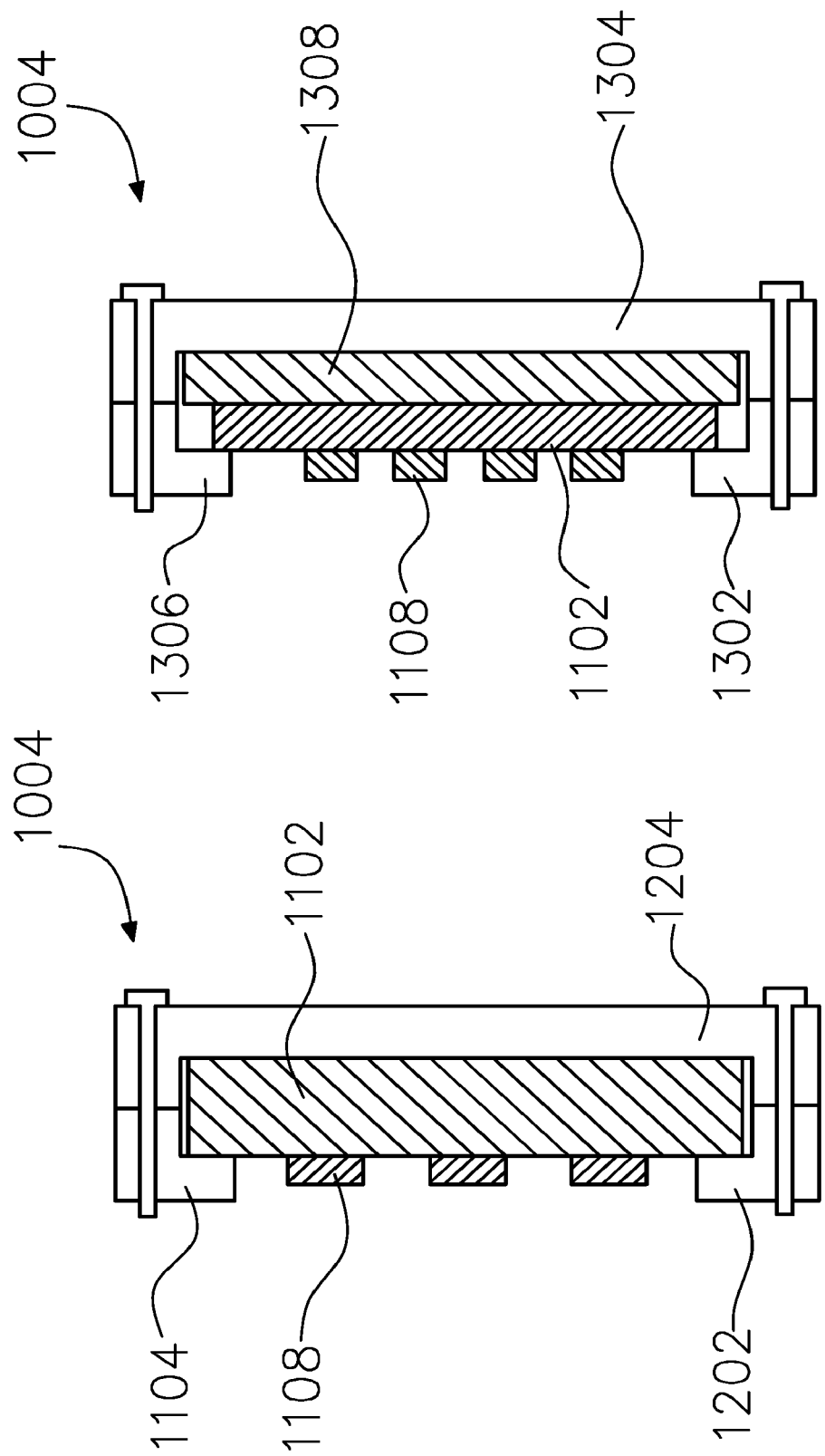

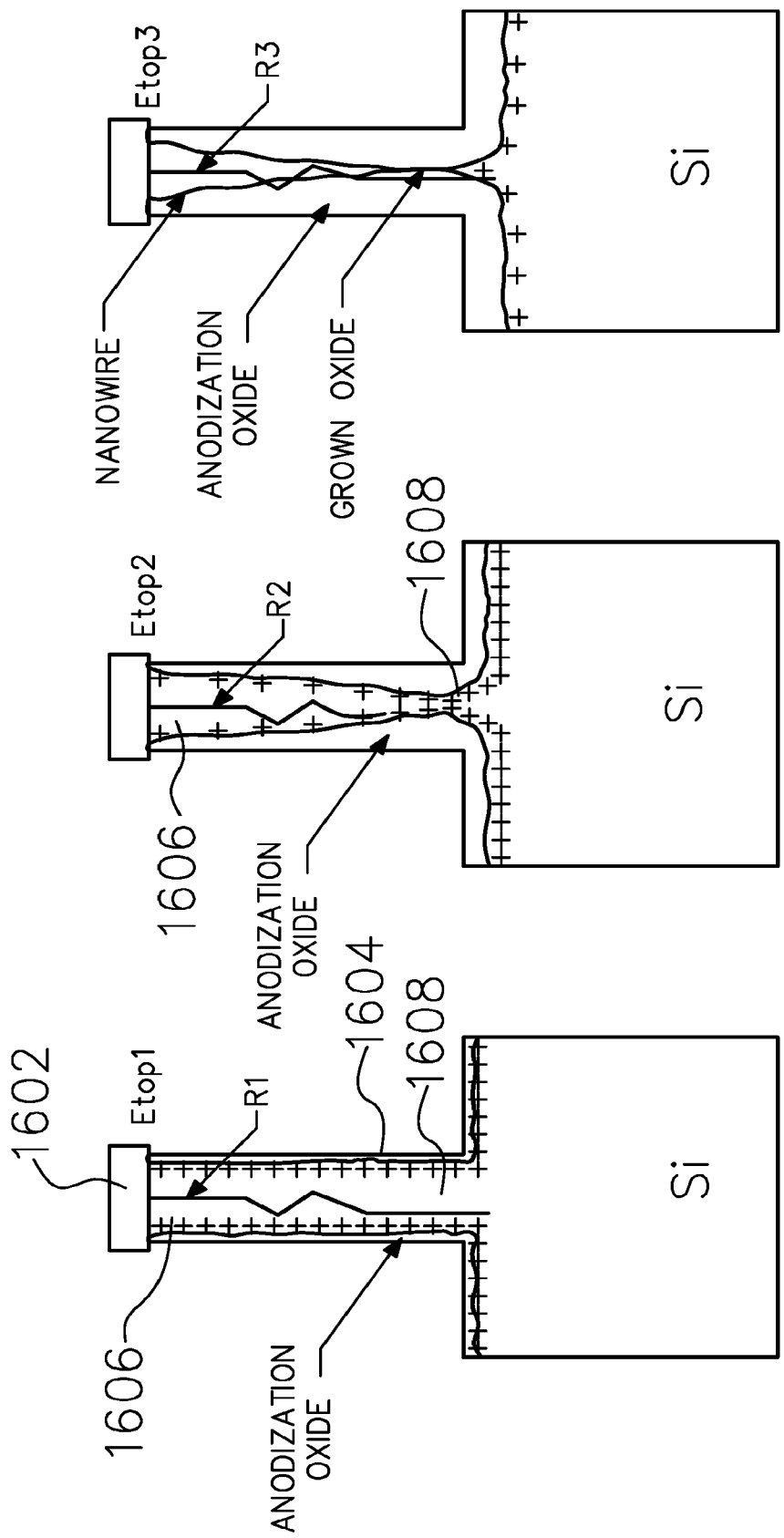

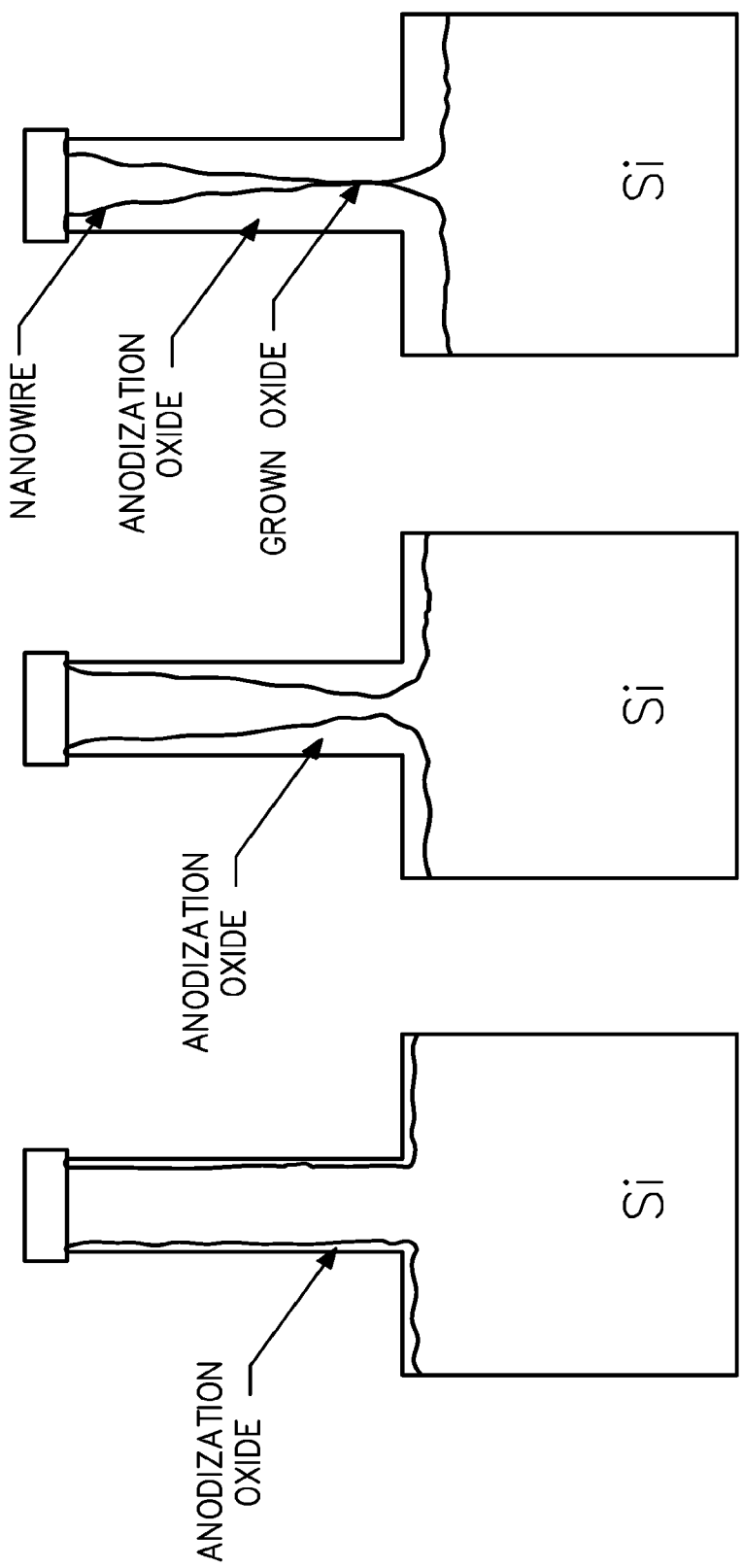

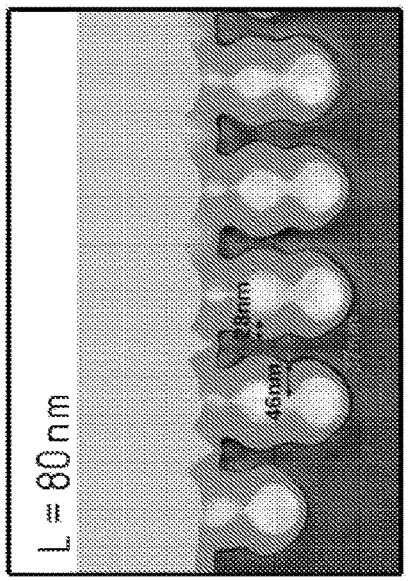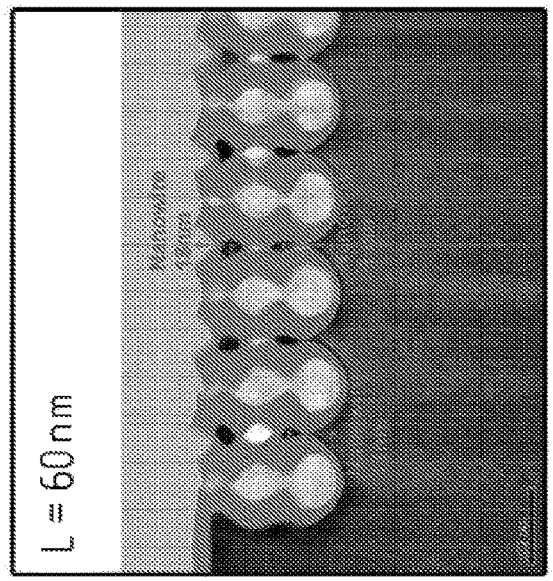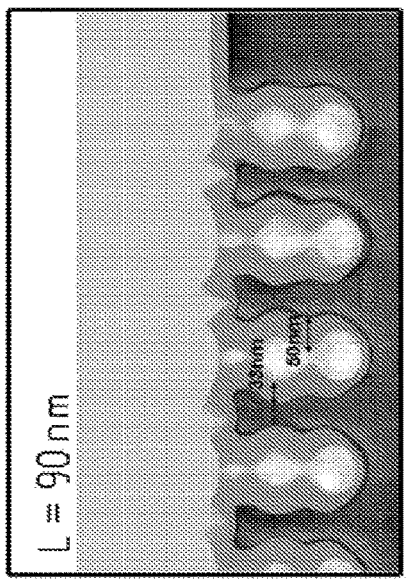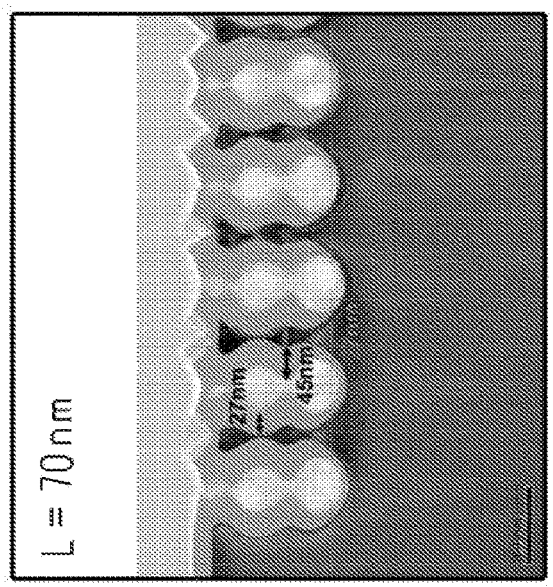

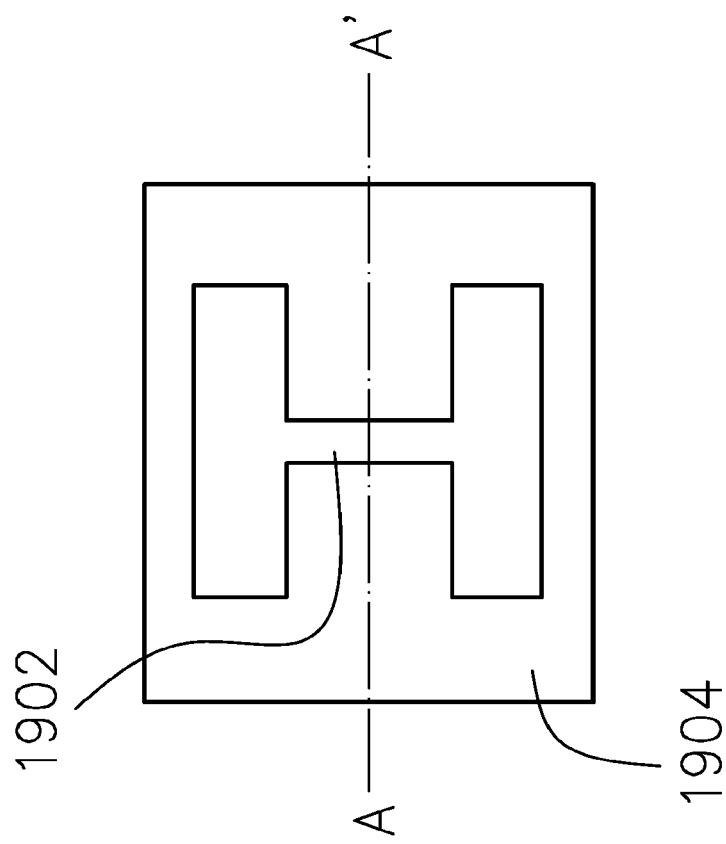
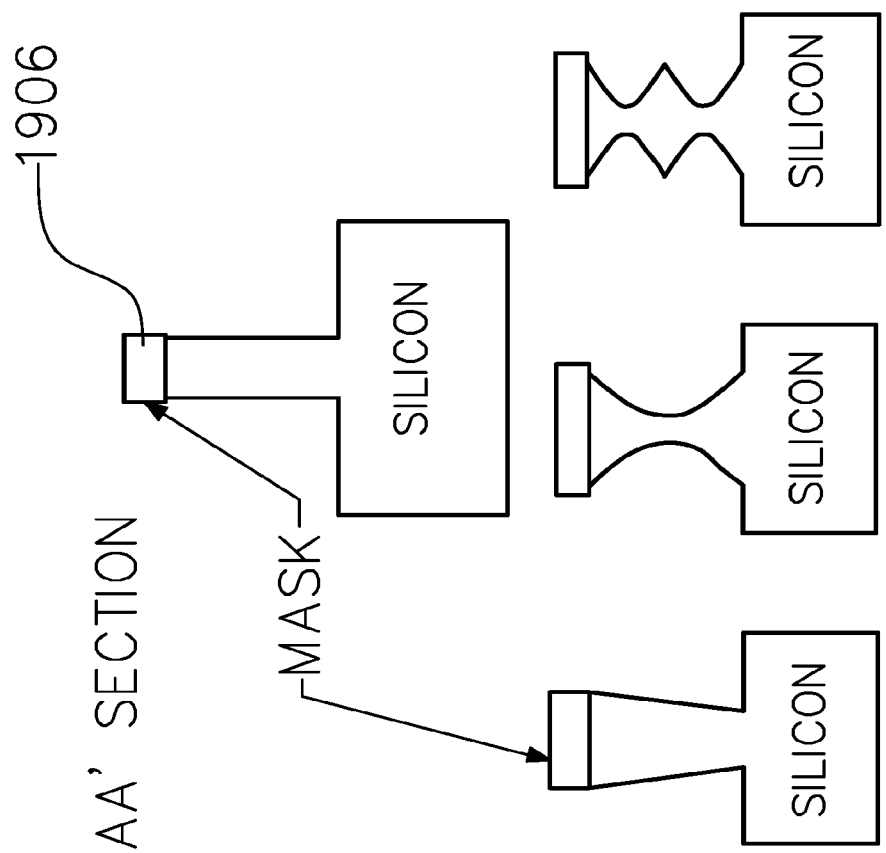
Fig.19(A)
Fig.19(B)

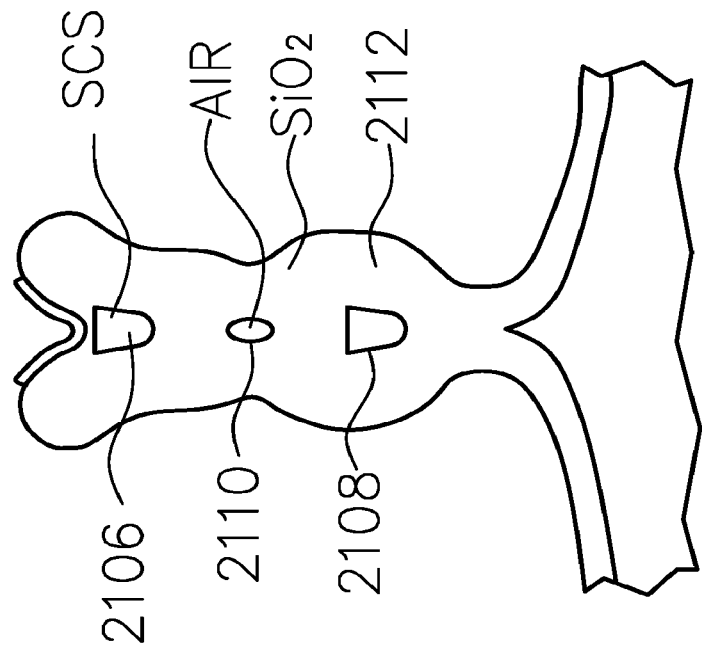
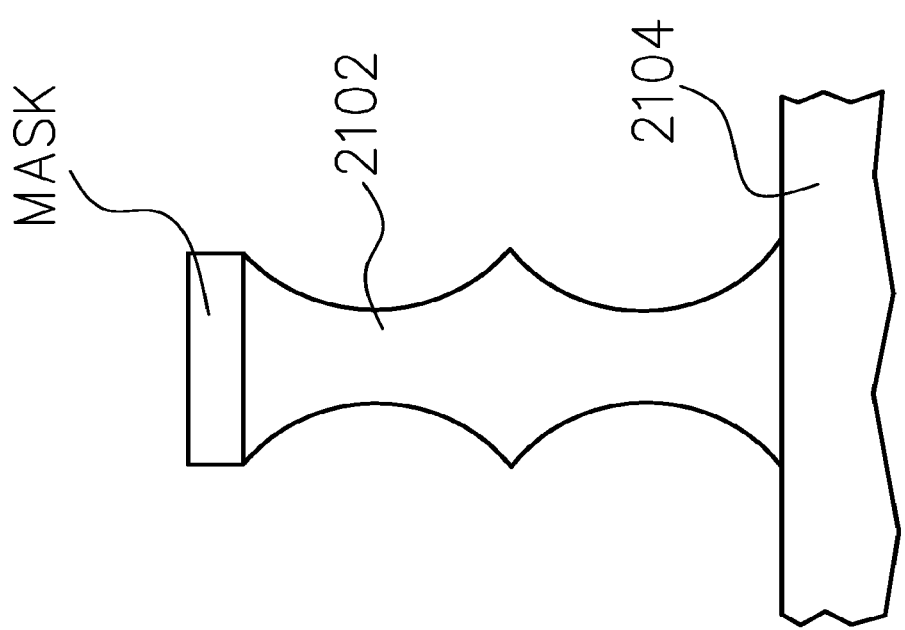
Fig.21(B)
Fig.21(A)

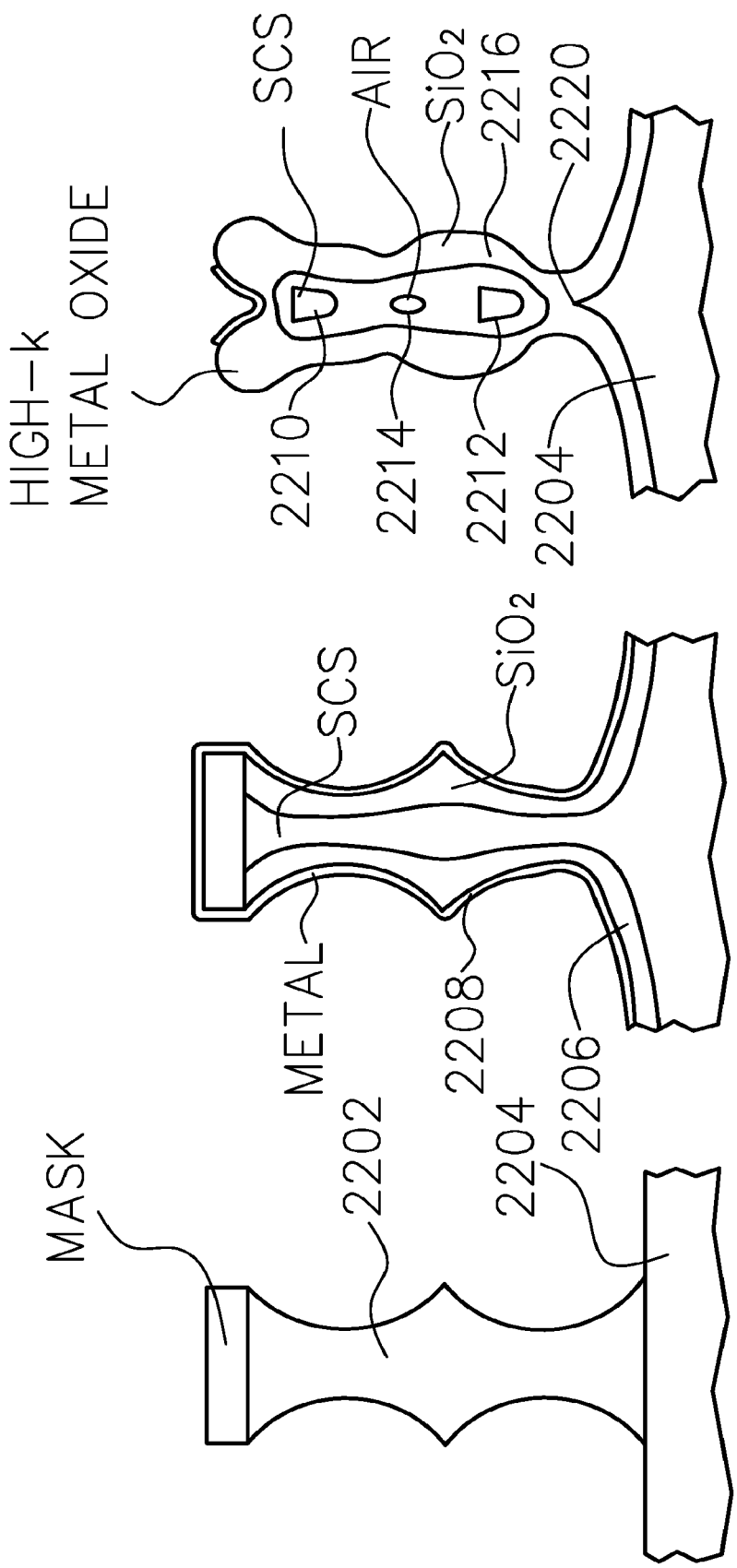

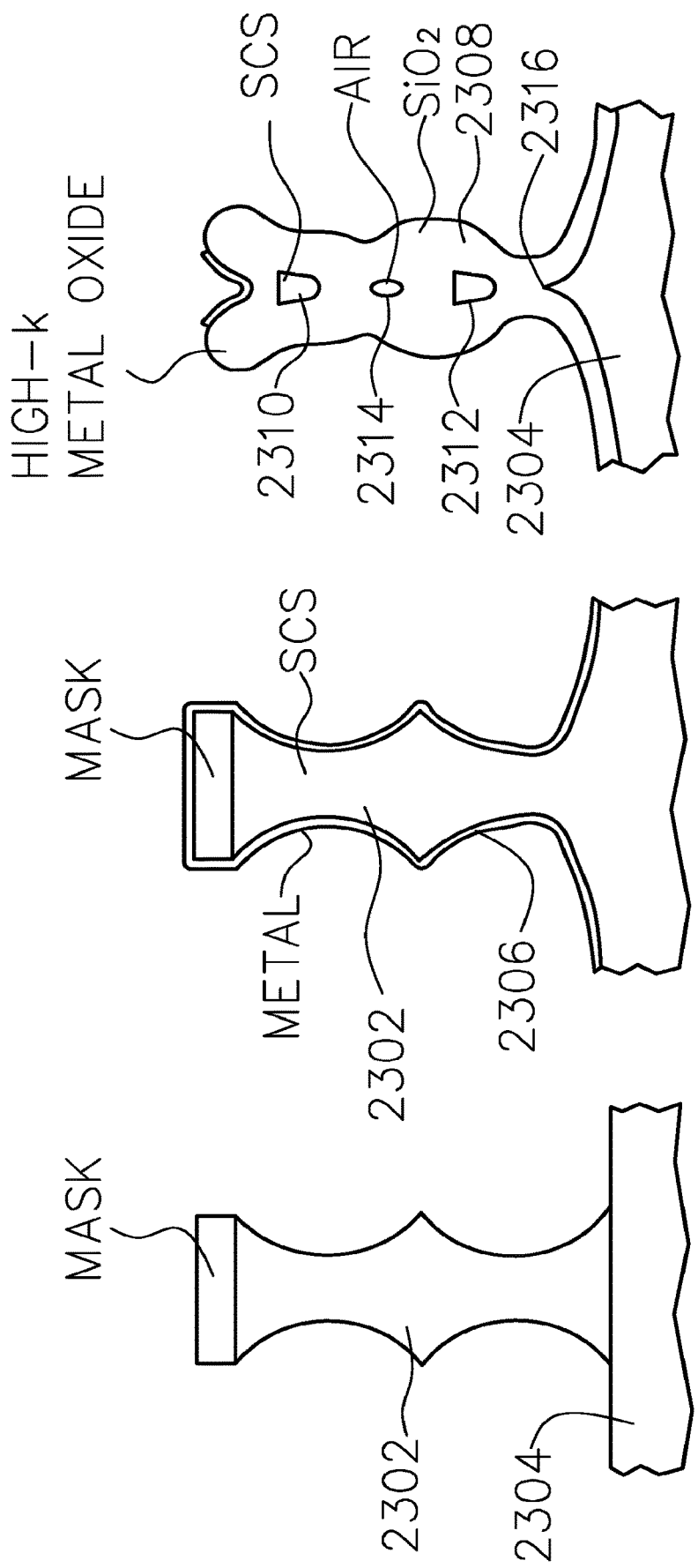

ANTIFUSE ARRAY AND METHOD OF FORMING ANTIFUSE USING ANODIC OXIDATION

PRIORITY CLAIM AND CROSS-REFERENCE

This application is a continuation of U.S. patent application Ser. No. 15/939,485, entitled "Antifuse Array and Method of Forming Antifuse Using Anodic Oxidation," filed Mar. 29, 2018, which is a divisional of U.S. patent application Ser. No. 14/527,885, entitled "Antifuse Array and Method of Forming Antifuse Using Anodic Oxidation," filed Oct. 30, 2014 (now U.S. Pat. No. 9,953,989, issued Apr. 24, 2018), which is a continuation-in-part of U.S. patent application Ser. No. 14/315,421, entitled "Systems and Methods for Forming Nanowires Using Anodic Oxidation," filed Jun. 26, 2014 (now U.S. Pat. No. 9,528,194, issued Dec. 27, 2016), which claims the benefit of U.S. Provisional Application No. 61/972,462, entitled "Equipment and Method for Fabricating Nanowire by Self Ending Anodization," filed Mar. 31, 2014, which applications are hereby incorporated herein by reference.

BACKGROUND

Semiconductor devices, such as antifuses, are an emerging research area in the semiconductor industry. However, size of the device is a challenge because of technology limitations. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 depicts an example diagram showing an anode electrode as part of the apparatus as shown in FIG. 10, in accordance with some embodiments.

FIG. 13 depicts another example diagram showing an anode electrode as part of the apparatus as shown in FIG. 10, in accordance with some embodiments.

FIG. 16(A)-FIG. 16(C) depict example diagrams of an anodic oxidation process performed on a protruding structure showing charge distribution, in accordance with some embodiments.

FIG. 17(A)-FIG. 17(C) depict example diagrams of an anodic oxidation process performed on a protruding structure without showing charge distribution, in accordance with some embodiments.

FIG. 18(A)-FIG. 18(D) depict example diagrams showing anodic oxidation performed on different wafer electrodes, in accordance with some embodiments.

FIG. 19(A) depicts an example diagram showing a pattern of a protruding structure on a wafer electrode, and FIG. 19(B) depicts an example diagram showing a cross-section view of the pattern along a cutline, in accordance with some embodiments.

FIG. 21(A) and FIG. 21(B) depict example diagrams showing formation of multiple nanowires through anodic oxidation, in accordance with some embodiments.

FIG. 22(A)-FIG. 22(C) depict other example diagrams showing formation of multiple nanowires through anodic oxidation, in accordance with some embodiments.

FIG. 23(A)-FIG. 23(C) depict other example diagrams showing formation of multiple nanowires through anodic oxidation, in accordance with some embodiments.

DETAILED DESCRIPTION

Figure 1:
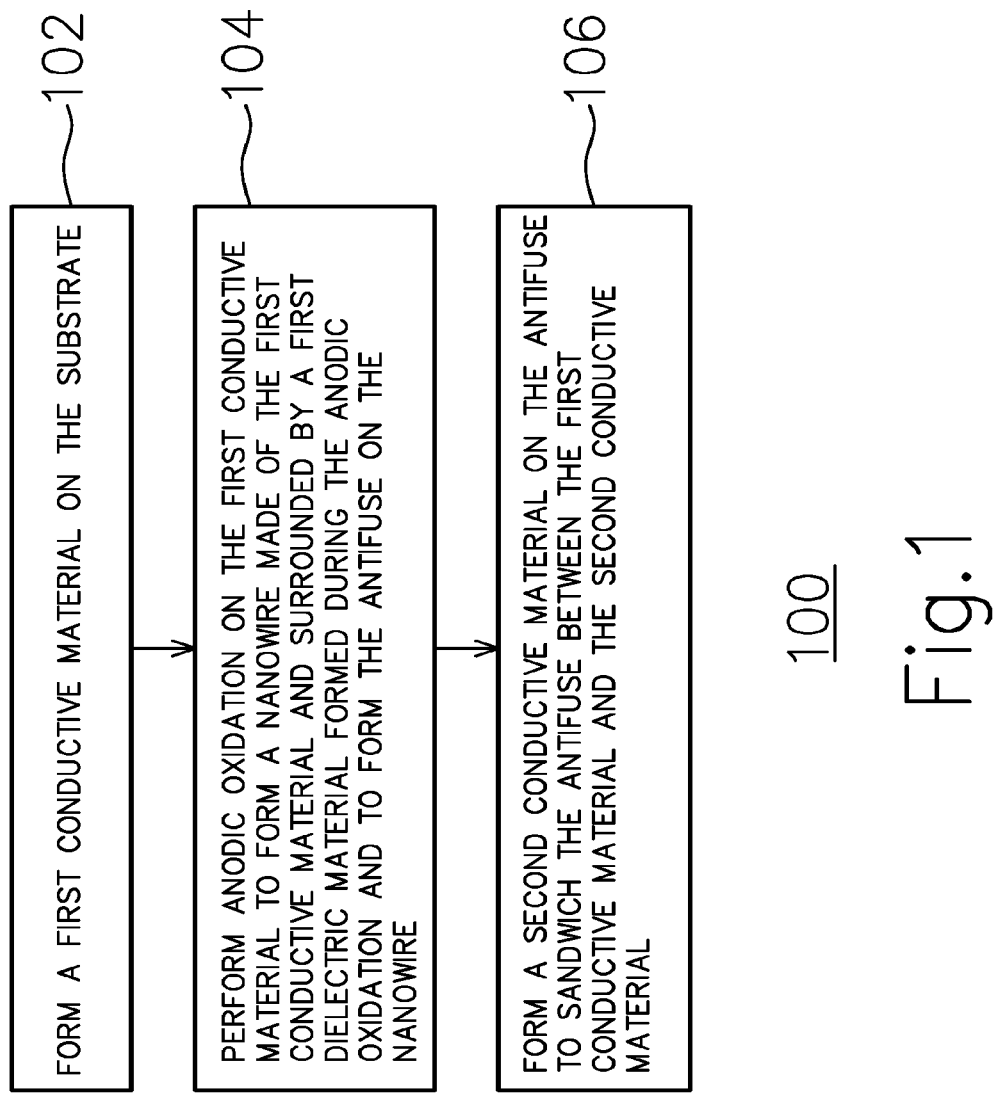
FIG. 1 is a flow chart of a method of forming an antifuse on a substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An antifuse is a configurable path having an associated programmable link. In its unprogrammed state, the antifuse has high impedance. For example, the antifuse is formed in a state whereby an insulator links two conductive portions (e.g., metal tracks). Applying pulses of relatively high voltage may produce, in the insulator, a conducting portion which grows between the two conductive portions (e.g., metal tracks). Once the conducting portion has been provided, it cannot be reversible. Therefore, this embodiment may be referred to as one-time-programmable (OTP).

Self-ending anodic oxidation is performed to form nanowires as the program line, on a wafer covered by dielectric material (e.g., single crystal Si, SOI, GaAs, or other semiconductor substrates can be demonstrated). In some embodiments, in addition to using semiconductor material as program lines or select lines, conducting material such as metal (e.g. Ti, Cr, and Zn) can be used. In some embodiments, nano-scale metal lines, used as select lines, can be patterned by using E-Beam/etching or EUV/resist trimming/etching or any nano-patterning processes such as charged-ion-beam (CIB). In some embodiments, the resistivity of the program line can be adjusted.

FIG. 1 is a flow chart of a method of forming an antifuse on a substrate in accordance with some embodiments. As shown in FIG. 1, the method 100 begins with the formation of a first conductive material, for example, the protrusion 202, on the substrate (operation 102). Self-ending anodic oxidation is performed on the first conductive material to form a nanowire, for example, the nanowire 302 made of the first conductive material and surrounded by a first dielectric material formed during the anodic oxidation and to form the antifuse, for example, the antifuse 306, on the nanowire (operation 104). A second conductive material, for example, the conductive layer 502, is formed on the antifuse to sandwich the antifuse between the first conductive material and the second conductive material (operation 106).

Figure 2:
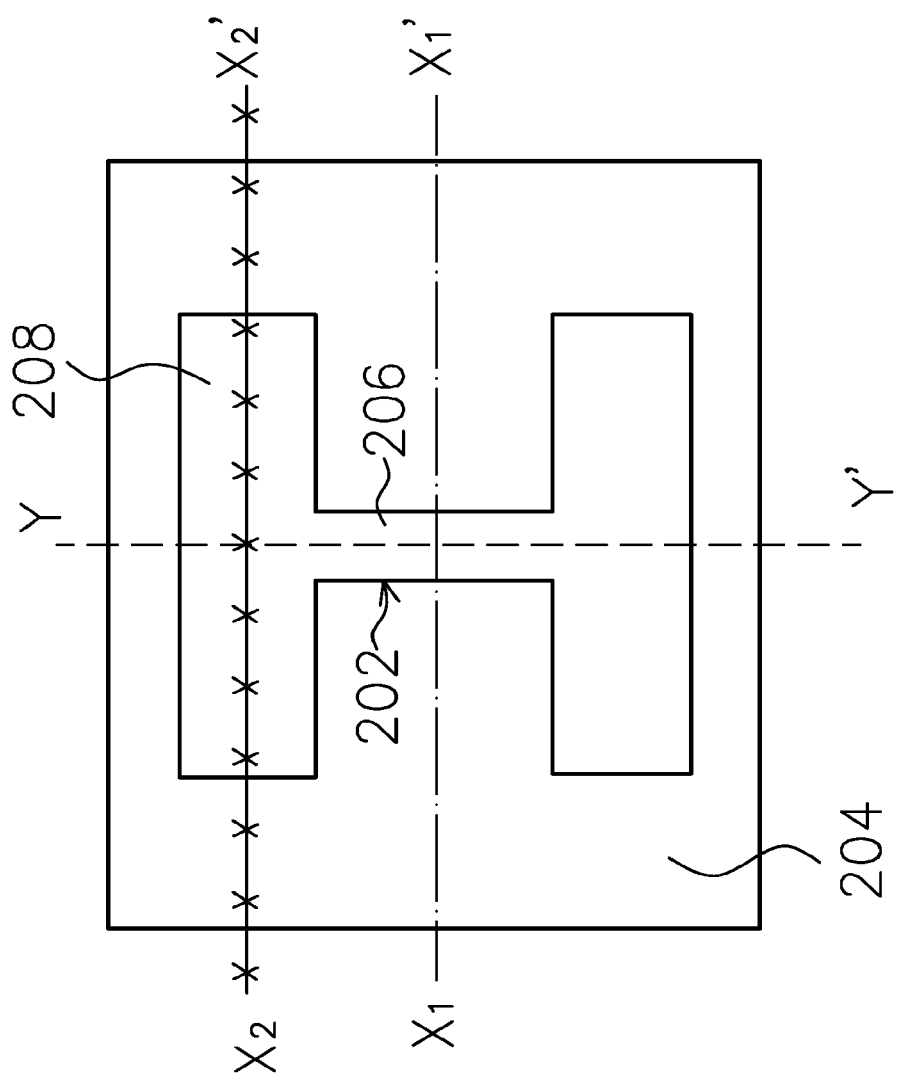
FIG. 2 is a top view of an exemplary semiconductor structure at one stage during fabrication of an antifuse, in accordance with some embodiments.

FIG. 2 is a top view of an exemplary semiconductor structure at one stage during fabrication of an antifuse, in accordance with some embodiments. As shown in FIG. 2, a protrusion 202 made of a first conductive material is patterned on a substrate 204 (e.g., operation 102 of FIG. 1). The substrate 204 may be made of, for example, Si, GaAs, semiconductor-on-insulator, III-V materials, or II-VI materials. For example, the patterning of the protrusion 202 is performed through e-beam lithography and etching. In some embodiments, the patterning of the protrusion 202 is performed through extreme ultraviolet lithography, resist trimming, and etching. In some embodiments, the patterning of the protrusion 202 is performed through a nano-patterning process, e.g., charged-ion-beam (CIB). In some embodiments, the protrusion 202 may be made of metal (e.g., Ti, Cr, or Zn) instead of a semiconductor material.

In some embodiments, the protrusion 202 includes a terminal portion 208 and a central portion 206. The terminal portion 208 may refer to a region that has been treated as a source/drain, or a region that has not been treated but is to be treated as a source/drain. The central portion 206 may refer to a region that has been treated as a channel, or a region that has not been treated but is to be treated as a channel.

Figure 2A:
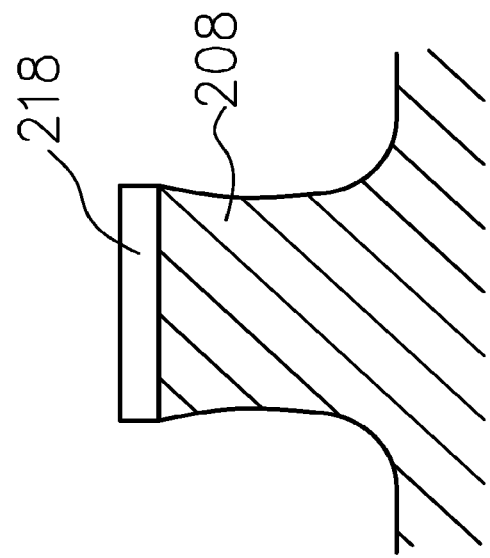
FIG. 2A is a cross section view of an exemplary semiconductor structure at one stage during fabrication of the antifuse along a cutline X1-X1' in FIG. 2, in accordance with some embodiments.

FIG. 2A is a cross section view of an exemplary semiconductor structure at one stage during fabrication of the antifuse along a cutline X1-X1' in FIG. 2, in accordance with some embodiments. As shown in FIG. 2A, the aspect ratio (the height divided by the width) of the central portion 206 of the protrusion 202 exceeds an aspect ratio threshold (e.g., 1). In some embodiments, a mask 216 is formed through lithography, or formed during a subsequent anodic oxidation process. In some embodiments, the protrusion 202 has a width of about 5 nm to about 100 nm and a height of about 5 nm to about 500 nm.

Figure 2B:
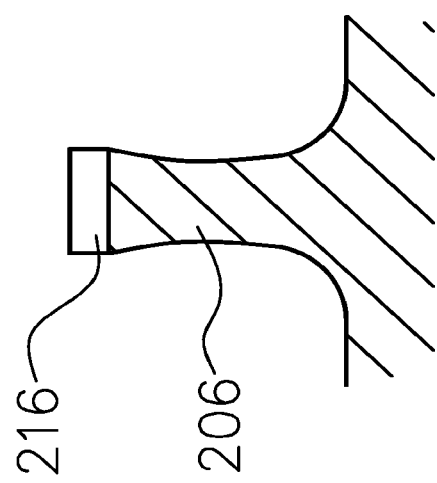
FIG. 2B is a cross section view of an exemplary semiconductor structure at one stage during fabrication of the antifuse along a cutline X2-X2' in FIG. 2, in accordance with some embodiments.

FIG. 2B is a cross section view of an exemplary semiconductor structure at one stage during fabrication of the antifuse along a cutline X2-X2' in FIG. 2, in accordance with some embodiments. As shown in FIG. 2B, the aspect ratio (the height divided by the width) of the terminal portion 208 of the protrusion 202 exceeds an aspect ratio threshold (e.g., 1) and is greater than that of the central portion 206. In some embodiments, a mask 218 is formed through lithography, or formed during a subsequent anodic oxidation process.

Figure 2C:
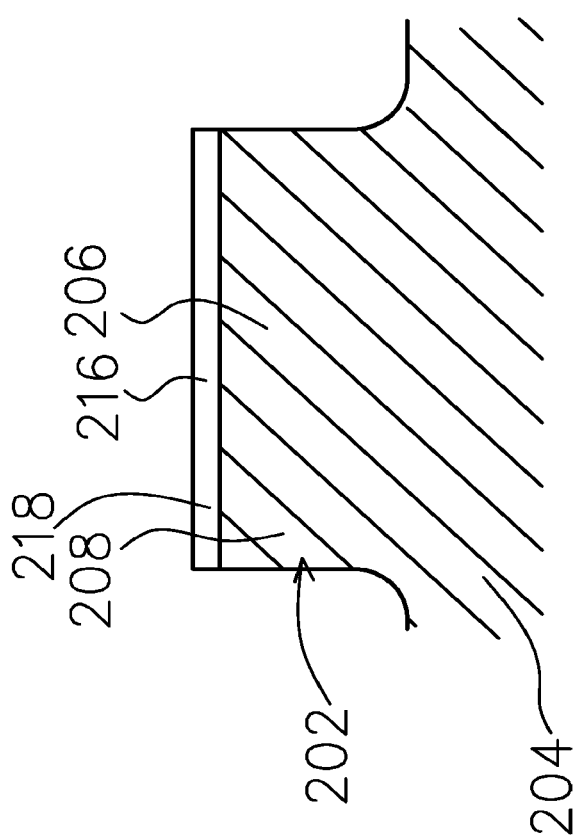
FIG. 2C is a cross section view of an exemplary semiconductor structure at one stage during fabrication of the antifuse along a cutline Y-Y' in FIG. 2, in accordance with some embodiments.

FIG. 2C is a cross section view of an exemplary semiconductor structure at one stage during fabrication of the antifuse along a cutline Y-Y' in FIG. 2, in accordance with some embodiments. As shown in FIG. 2C, the protrusion 202 is formed on the substrate 204. The central portion 206 refers to a central region of the protrusion 202, and the terminal portion 208 refers to a tail region of the protrusion 202.

Figure 3B:
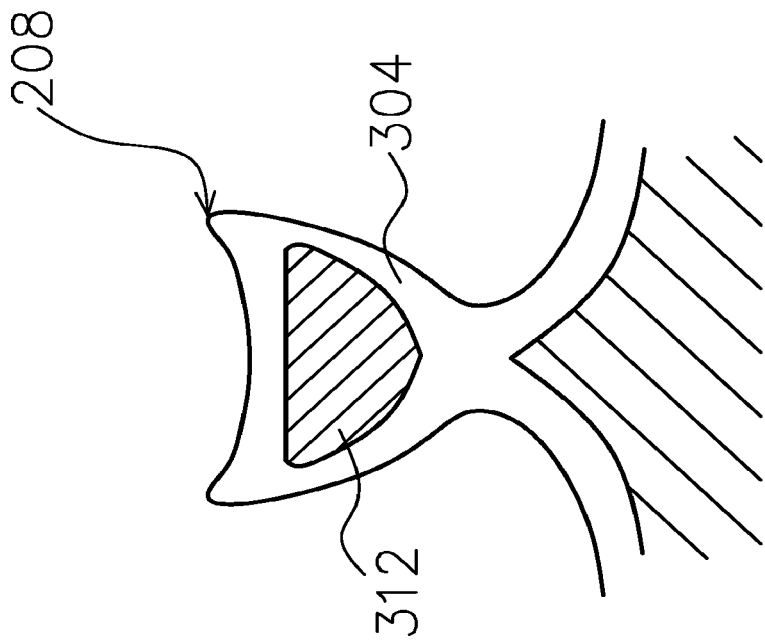
FIG. 3B is a cross section view of an exemplary semiconductor structure at one stage during fabrication of the antifuse along a cutline X2-X2', in accordance with some embodiments.
Figure 3A:
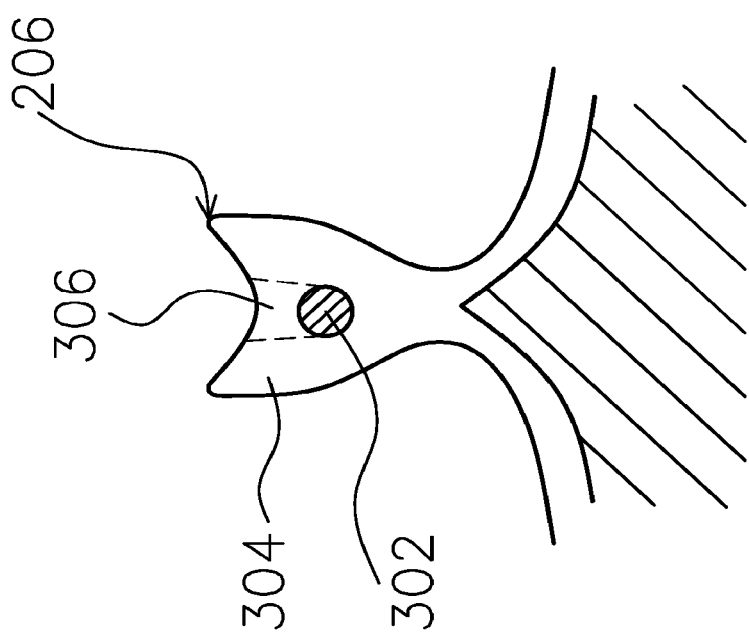
FIG. 3A is a cross section view of an exemplary semiconductor structure at one stage during fabrication of the antifuse along a cutline X1-X1', in accordance with some embodiments.

FIG. 3A is a cross section view of an exemplary semiconductor structure at one stage during fabrication of the antifuse along a cutline X1-X1', in accordance with some embodiments. As shown in FIG. 3A, self-ending anodic oxidation is performed on the central portion 206 of the protrusion 202 so as to oxidize the central portion 206 except for an inner region which is used as a nanowire 302 (e.g., operation 104 of FIG. 1). The nanowire 302 (e.g., Si) is surrounded by a first dielectric material 304 (e.g., oxidized central portion, such as SiO2) formed during the anodic oxidation. A thin portion of the first dielectric material 304 above the nanowire 302 is used as an antifuse 306. In some embodiments, when the protrusion 202 is made of metal (e.g., Ti, Cr, or Zn), the first dielectric material 304 is made of metal oxide. In some embodiments, the antifuse 306 made of a material having dielectric strength of about 10 MV/m to about 1000 MV/m.

In some embodiments, a non-uniform electric field applied to the central portion 206 causes non-uniform anodic oxidation. For example, as shown in FIG. 3A, a width of a top part of the first dielectric material 304 is larger than or equal to a width of a bottom part of the first dielectric material 304. In some embodiments, the protrusion 202 may undergo alternation of anodic oxidation and etching, so that the nanowire 302 with small sizes (e.g., 5-7 nm) covered with the first dielectric material 304 (e.g., oxidized central portion) can be formed. In some embodiments, the nanowire 302 is used as a select line for an antifuse array.

FIG. 3B is a cross section view of an exemplary semiconductor structure at one stage during fabrication of the antifuse along a cutline X2-X2', in accordance with some embodiments. As shown in FIG. 3B, self-ending anodic oxidation is performed on the terminal portion 208 of the protrusion 202 so as to oxidize the terminal portion 208 except for an inner region which is used as a source/drain 312 of the nanowire 302. The source/drain 312 (e.g., Si) is surrounded by the first dielectric material 304 (e.g., oxidized terminal portion, such as SiO2) formed during the anodic oxidation.

In some embodiments, non-uniform electric field applied to the terminal portion 208 causes non-uniform anodic oxidation. For example, as shown in FIG. 3B, a width of a top part of the first dielectric material 304 is larger than or equal to a width of a bottom part of the first dielectric material 304.

Figure 3C:
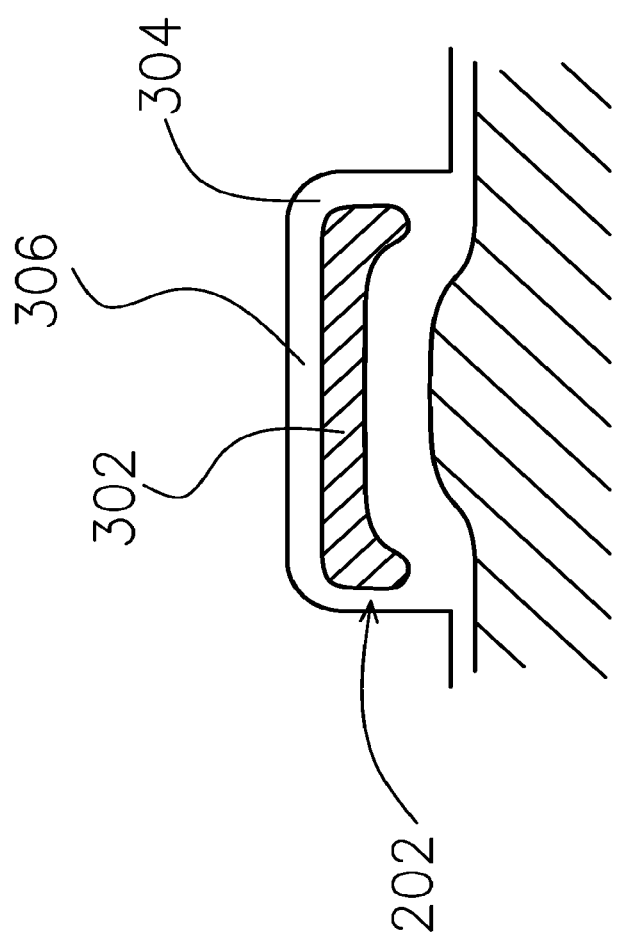
FIG. 3C is a cross section view of an exemplary semiconductor structure at one stage during fabrication of the antifuse along a cutline Y-Y', in accordance with some embodiments.

FIG. 3C is a cross section view of an exemplary semiconductor structure at one stage during fabrication of the antifuse along a cutline Y-Y', in accordance with some embodiments. As shown in FIG. 3C, self-ending anodic oxidation is performed on the protrusion 202 so as to oxidize the protrusion 202 except for an inner region which is used as a nanowire 302. The nanowire 302 (e.g., Si) is surrounded by a first dielectric material 304 (e.g., oxidized central portion, such as SiO2) formed during the anodic oxidation. A thin portion of the first dielectric material 304 above the nanowire 302 is used as the antifuse 306.

Figure 4:
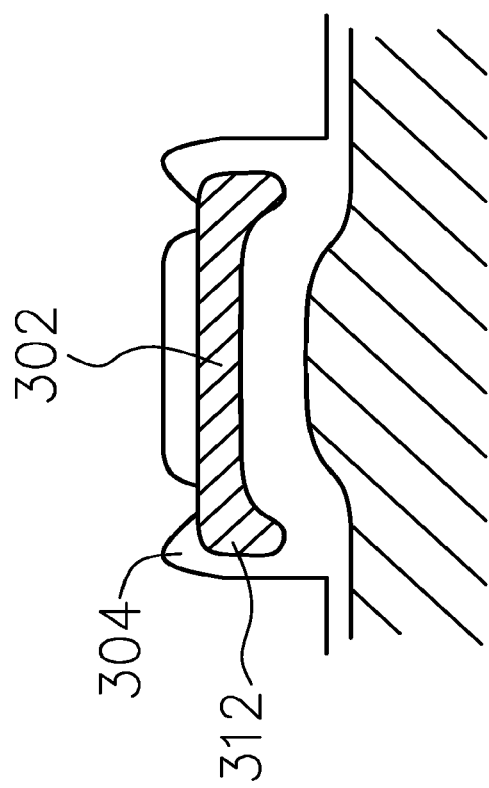
FIG. 4 is a cross section view of an exemplary semiconductor structure at one stage during fabrication of the antifuse along a cutline Y-Y', in accordance with some embodiments.

FIG. 4 is a cross section view of an exemplary semiconductor structure at one stage during fabrication of the antifuse along a cutline Y-Y', in accordance with some embodiments. As shown in FIG. 4, lithography and etching are performed on the first dielectric material 304 to provide contact areas for the source/drain 312 of the nanowire 302.

Figure 5:
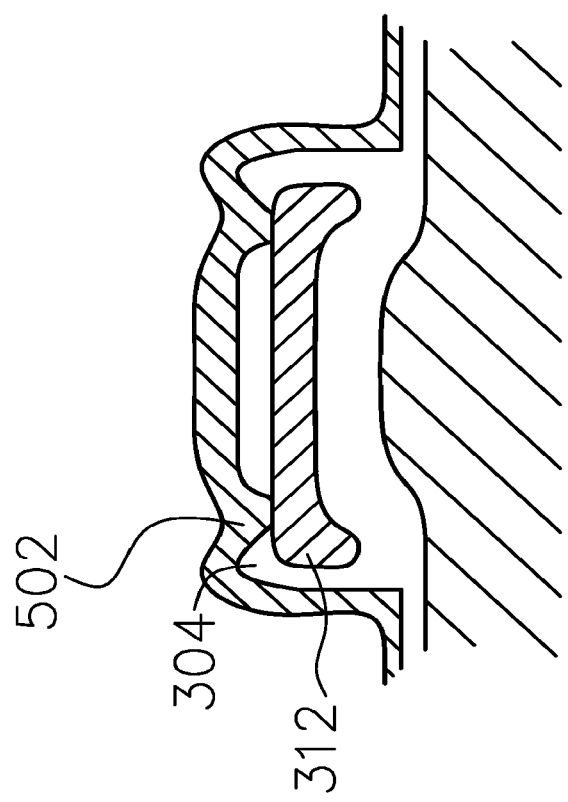
FIG. 5 is a cross section view of an exemplary semiconductor structure at one stage during fabrication of the antifuse along a cutline Y-Y', in accordance with some embodiments.

FIG. 5 is a cross section view of an exemplary semiconductor structure at one stage during fabrication of the antifuse along a cutline Y-Y', in accordance with some embodiments. As shown in FIG. 5, a conductive layer 502 is disposed on the source/drain 312 and the first dielectric material 304. Charge-ion-beam can also be used to deposit the conductive layer 502 (e.g., metal such as Ti, Cr, or Zn).

Figure 6:
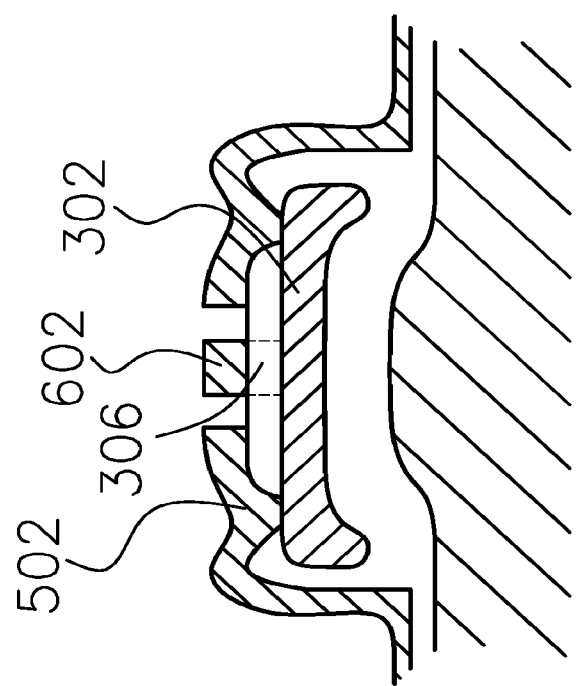
FIG. 6 is a cross section view of an exemplary semiconductor structure at one stage during fabrication of the antifuse along a cutline Y-Y', in accordance with some embodiments.

FIG. 6 is a cross section view of an exemplary semiconductor structure at one stage during fabrication of the antifuse along a cutline Y-Y', in accordance with some embodiments. As shown in FIG. 6, lithography and etching are performed on the conductive layer 502 to provide single program line 602 for an antifuse array. Applying pulses of relatively high voltage on the program line 602 may generate oxide breakdown in the antifuse 306, producing a conducting portion which grows between the program line 602 and the nanowire 302 (select line). Once the conducting portion has been provided, it cannot be reversible. Therefore, this embodiment may refer to as one-time-programmable (OTP).

A semiconductor structure 600 is provided, which includes one program line (program line 602), one select line (nanowire 302), and one antifuse 306. When the program line 602 and the nanowire 302 are selected with relatively high voltage, the antifuse 306 breaks down and connects the program line 602 and the nanowire 302.

In some embodiments, when semiconductor structure 600 is used as a one-time programmable device, the semiconductor structure 600 includes a nanowire 302 made of a first conductive material; the program line 602 (e.g., a gate) made of a second conductive material; and the antifuse 306 (e.g., a gate oxide) between the nanowire 302 and the program line 602 (e.g., the agate). The antifuse 306 may be, anodically oxidized from the first conductive material. In some embodiments, one terminal of the nanowire 302 is connected to a source and the other terminal of the nanowire 302 is connected to a drain. The antifuse 306 (e.g., the gate oxide) is made of a material having a dielectric strength of about 10 MV/m to about 1000 MV/m.

Figure 7:
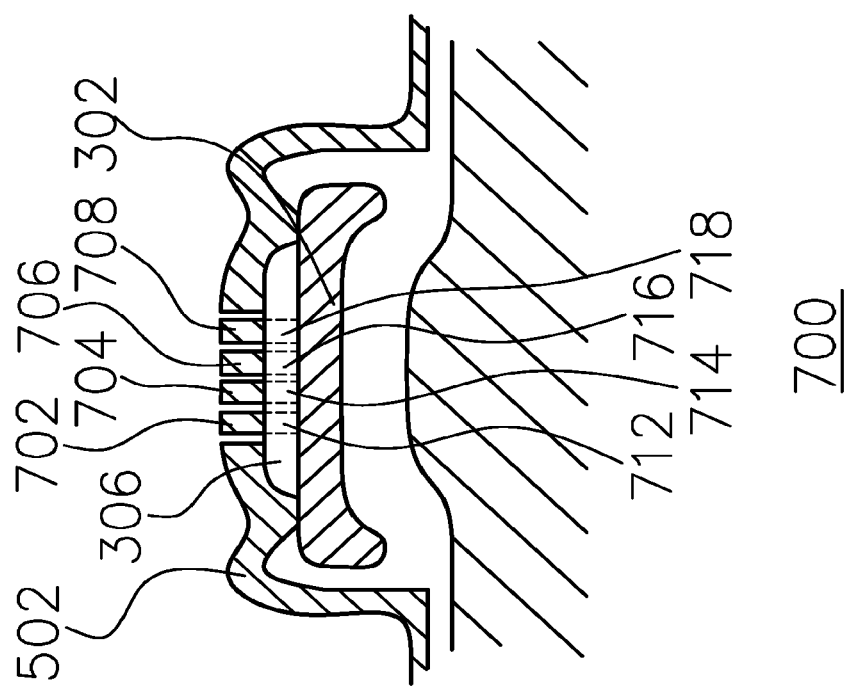
FIG. 7 is a cross section view of an exemplary semiconductor structure at one stage during fabrication of the antifuse along a cutline Y-Y', in accordance with some embodiments.

FIG. 7 is a cross section view of an exemplary semiconductor structure at one stage during fabrication of the antifuse along a cutline Y-Y', in accordance with some embodiments. As shown in FIG. 7, continuing from FIG. 5, lithography and etching are performed on the conductive layer 502 to provide multiple program lines 702-708 for an antifuse array. Applying pulses of relatively high voltage on the program lines 702-708 may respectively generate oxide breakdown in the antifuse 306, producing a conducting portions which grow between the program lines 702-708 and the nanowire 302 (select line). Once the conducting portions have been provided, it cannot be reversible. Therefore, this embodiment may refer to as one-time-programmable (OTP).

In other words, the antifuse 306 may include a set of antifuse portions 712-718. A semiconductor structure 700 is provided, which includes four program lines (program lines 702-708), one select line (nanowire 302), and four antifuse portions 712-718. For example, when the program line 702 and the nanowire 302 are selected with relatively high voltage, the antifuse 712 breaks down and connects the program line 702 and the nanowire 302. After that, when the program line 704 and the nanowire 302 are further selected with relatively high voltage, the antifuse 714 breaks down and further connects the program lines 702, 704 and the select line 302.

Figure 8:
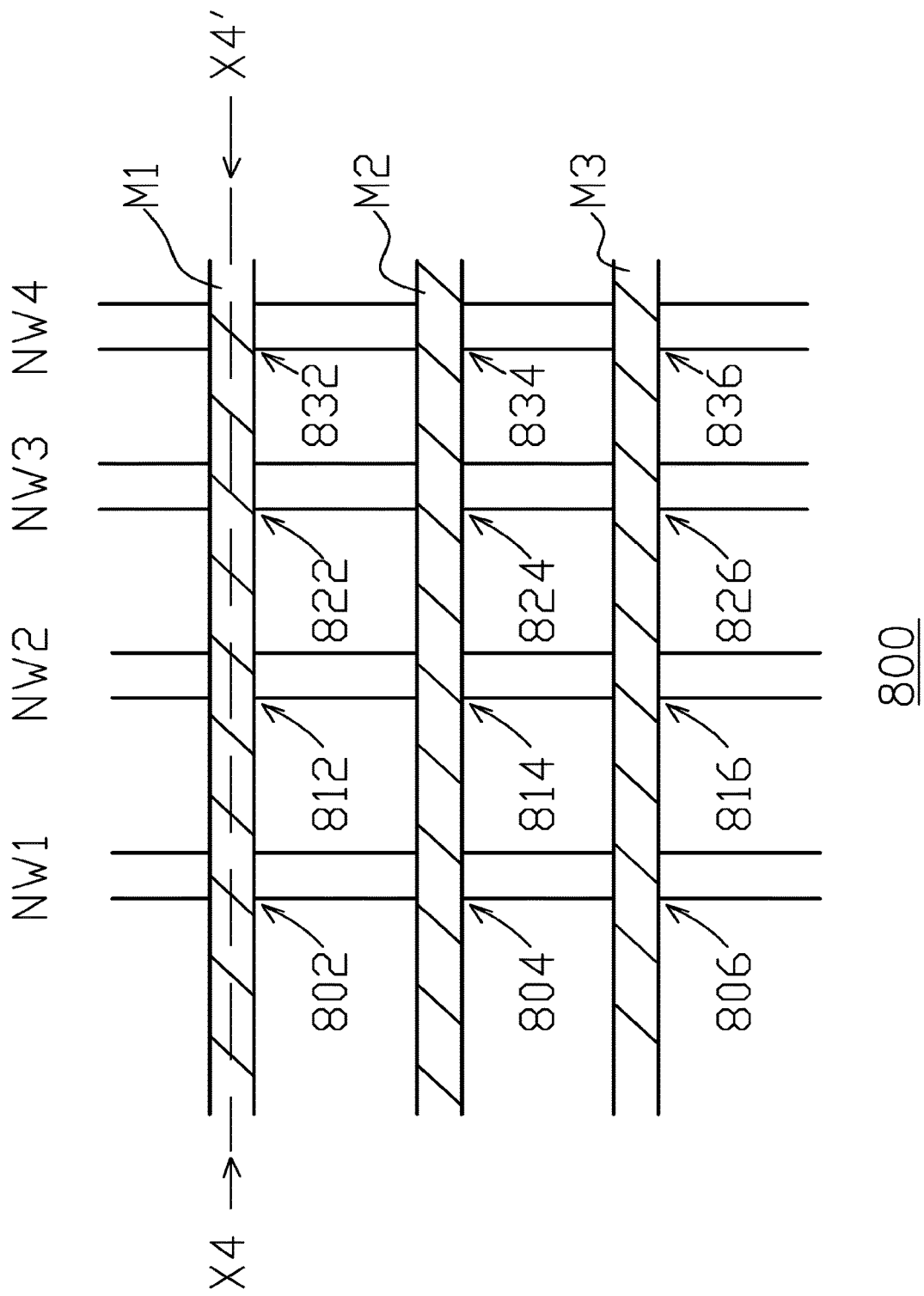
FIG. 8 is a top view of an exemplary antifuse array, in accordance with some embodiments.

FIG. 8 is a top view of an exemplary antifuse array, in accordance with some embodiments. As shown in FIG. 8, an antifuse array 800 is provided. The antifuse array 800 includes a plurality of antifuse portions 802-836, a plurality of program lines (e.g., M1-M3), and a plurality of select lines (e.g., NW1-NW4). The program lines M1-M3 intersects with but are not directly in contact with the select lines NW1-NW4. The antifuse portions 802-836 are respectively formed between the intersection of the program lines M1-M3 and the select lines NW1-NW4. For example, when the program line M1 and the select line NW1 are selected with relatively high voltage, the antifuse 802 breaks down and connects the program line M1 and the select line NW1. After that, when the program line M1 and the select line NW2 are further selected with relatively high voltage, the antifuse 812 breaks down and further connects the program line M1 and the select lines NW1, NW2.

Figure 9:
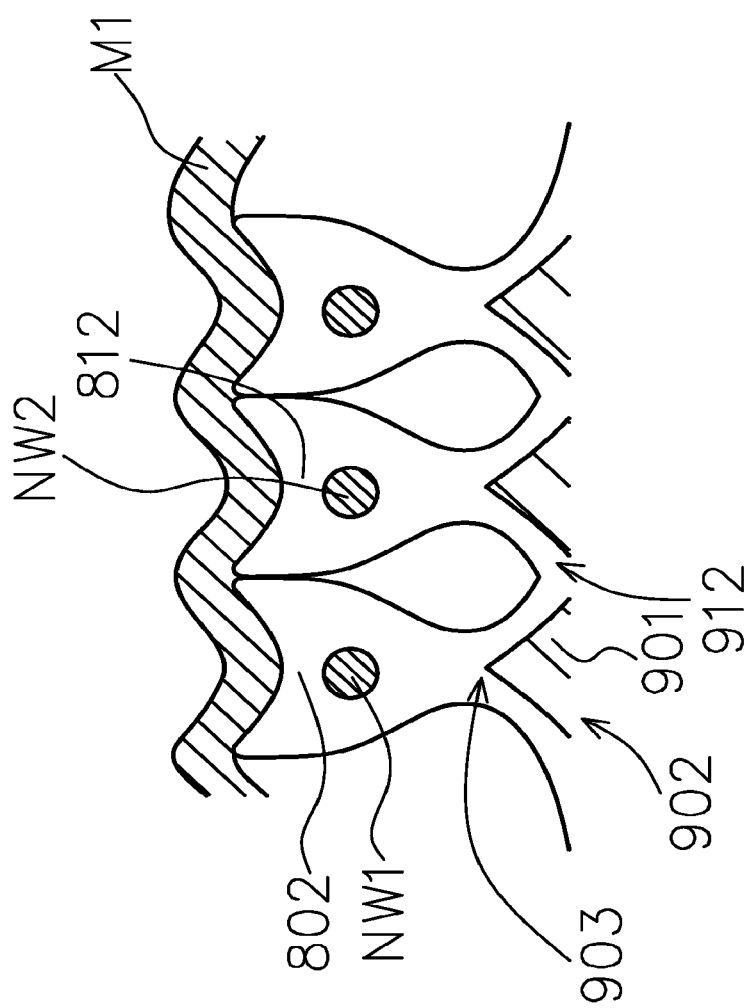
FIG. 9 is a sectional view of the exemplary antifuse array along a cutline X4-X4' in FIG. 8, in accordance with some embodiments.

FIG. 9 is a sectional view of the exemplary antifuse array along a cutline X4-X4' in FIG. 8, in accordance with some embodiments. As shown in FIG. 9, the antifuse array 800 is disposed on a substrate 901. A first protrusion 902 is provided in the antifuse array 800. The first protrusion 902 includes the select line NW1. The program line M1 is provided on the first protrusion 902. The first protrusion 902 includes the antifuse 802 between the select line NW1 and the program line M1, and the substrate 901 includes a ridge 903 under the first protrusion 902. In some embodiments, the first protrusion 902 has a width of about 5 nm to about 100 nm and a height of about 5 nm to about 500 nm.

A second protrusion 912 is provided in the antifuse array 800 and adjacent to the first protrusion 902. The second protrusion 912 has similar configuration to the first protrusion 902. In some embodiments, the second protrusion 912 has a width of about 5 nm to about 100 nm and a height of about 5 nm to about 500 nm.

Details of formation of the antifuse array 800 will be described. Before formation of the program line M1, self-ending anodic oxidation is performed on the first protrusion 902 so as to oxidize the first protrusion 902 except for an inner region which is used as the select line NW1. The select line NW1 (e.g., Si) is surrounded by a dielectric material (e.g., oxidized central portion, such as SiO2). A thin portion of the dielectric material above the select line NW1 is used as the antifuse 802. In some embodiments, when the first protrusion 902 is made of metal (e.g., Ti, Cr, or Zn), the dielectric material is made of metal oxide.

In some embodiments, non-uniform electric field applied to the first protrusion 902 causes non-uniform anodic oxidation. For example, as shown in FIG. 9, a width of a top part of the dielectric material is larger than or equal to a width of a bottom part of the dielectric material. In some embodiments, the first protrusion 902 may undergo alternation of anodic oxidation and etching, so that the antifuse 802 with small sizes (e.g., 5-7 nm) covered with the dielectric material can be formed.

Returning to FIG. 1, in some embodiments, the operation of forming the first conductive material on the substrate further comprises patterning the substrate to form a protrusion by using at least one of E-beam etching, EUV etching, and charged-ion beam. In some embodiments, the operation of performing anodic oxidation on the first conductive material further comprises placing the first conductive material in an electrolytic solution. In some embodiments, the operation of forming the antifuse on the nanowire further comprises forming the first conductive material by using a material having dielectric strength of about 10 MV/m to about 1000 MV/m. In some embodiments, the operation of forming the first conductive material on the substrate further comprises forming the first conductive material by using at least one of silicon and metal.

In some embodiments, the operation of forming the second conductive material on the antifuse material further comprises forming the second conductive material by using at least one of silicon and metal. In some embodiments, the operation of forming the first conductive material on the antifuse comprises forming the first conductive material having an aspect ratio greater than a threshold. In some embodiments, the operation of forming the first conductive material on the substrate further comprises forming the first conductive material having a width of about 5 nm to about 100 nm.

In some embodiments, the operation of forming the first conductive material on the substrate further comprises forming the first conductive material having a height of about 5 nm to about 500 nm. The method 100 further comprises: removing portions of the first dielectric material to expose two terminals of the nanowire; and forming the second conductive material on each of the terminals of the nanowire. In some embodiments, the operation of forming the second conductive material on the antifuse to sandwich the antifuse between the first conductive material and the second conductive material further comprises forming the first conductive material and the second conductive material in a configuration selected from the group consisting of: (1) the second conductive material in a second layer over the first conductive material in a first layer in a T-shape as viewed from above; (2) the second conductive material in a second layer over the first conductive material in a first layer in an approximately cross-shaped relationship as viewed from above; (3) the first conductive material and the second conductive material in a T-shape in a single layer as viewed from above; and (4) the first conductive material and the second conductive material in parallel in a single layer as viewed from above.

According to another embodiment, a method of forming an antifuse on a substrate is provided. The method includes the following operations: forming a first conductive material on the substrate; performing anodic oxidation on the first conductive material to form a nanowire made of the first conductive material and surrounded by a first dielectric material formed during the anodic oxidation and to form the antifuse on the nanowire; and forming a second conductive material on the antifuse to sandwich the antifuse between the first conductive material and the second conductive material.

According to another embodiment, a semiconductor device is provided. The device includes: a substrate; a first protrusion on the substrate; a first select line in the first protrusion; and a first program line on the first protrusion, wherein the first protrusion comprises a first antifuse between the first select line and the first program line, and the substrate comprises a first ridge under the first protrusion.

According to another embodiment, a one-time programmable device is provided. The device includes: a nanowire made of a first conductive material; a gate made of a second conductive material; and a gate oxide between the nanowire and the gate, and anodically oxidized from the first conductive material, wherein the gate oxide works as an antifuse between the nanowire and the gate.

Figure 10:
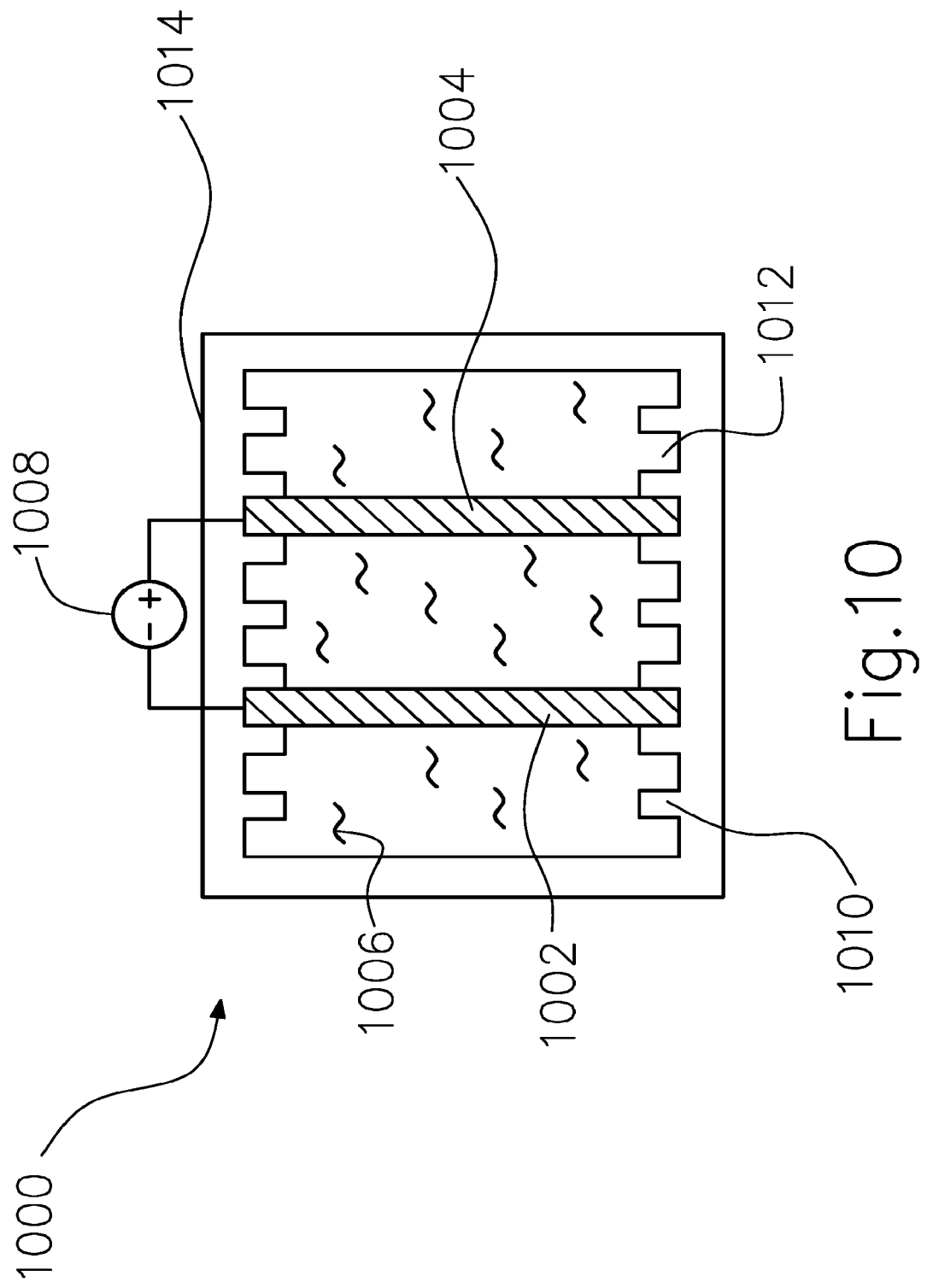
FIG. 10 depicts an example diagram showing a top view of an apparatus for anodic oxidation for forming nanowires, in accordance with some embodiments.

FIG. 10 depicts an example diagram showing a top view of an apparatus for anodic oxidation for forming nanowires, in accordance with some embodiments. As shown in FIG. 10, in the apparatus 1000, a cathode electrode 1002 including metal materials (e.g., Ag, Pt, etc.) and an anode electrode 1004 including a semiconductor wafer (e.g., Si, GaAs, semiconductor-on-insulator, III-V materials, II-VI materials, etc.) are placed (e.g., immersed) in an electrolytic solution 1006 for anodic oxidation. The cathode electrode 1002 and the anode electrode 1004 are connected electrically to a power supply 1008. An electrode holder 1010 includes multiple slots 1012 for holding the cathode electrode 1002 and the anode electrode 1004. The apparatus 1000 further includes a tank 1014 to contain the electrolytic solution 1006.

Figure 11:
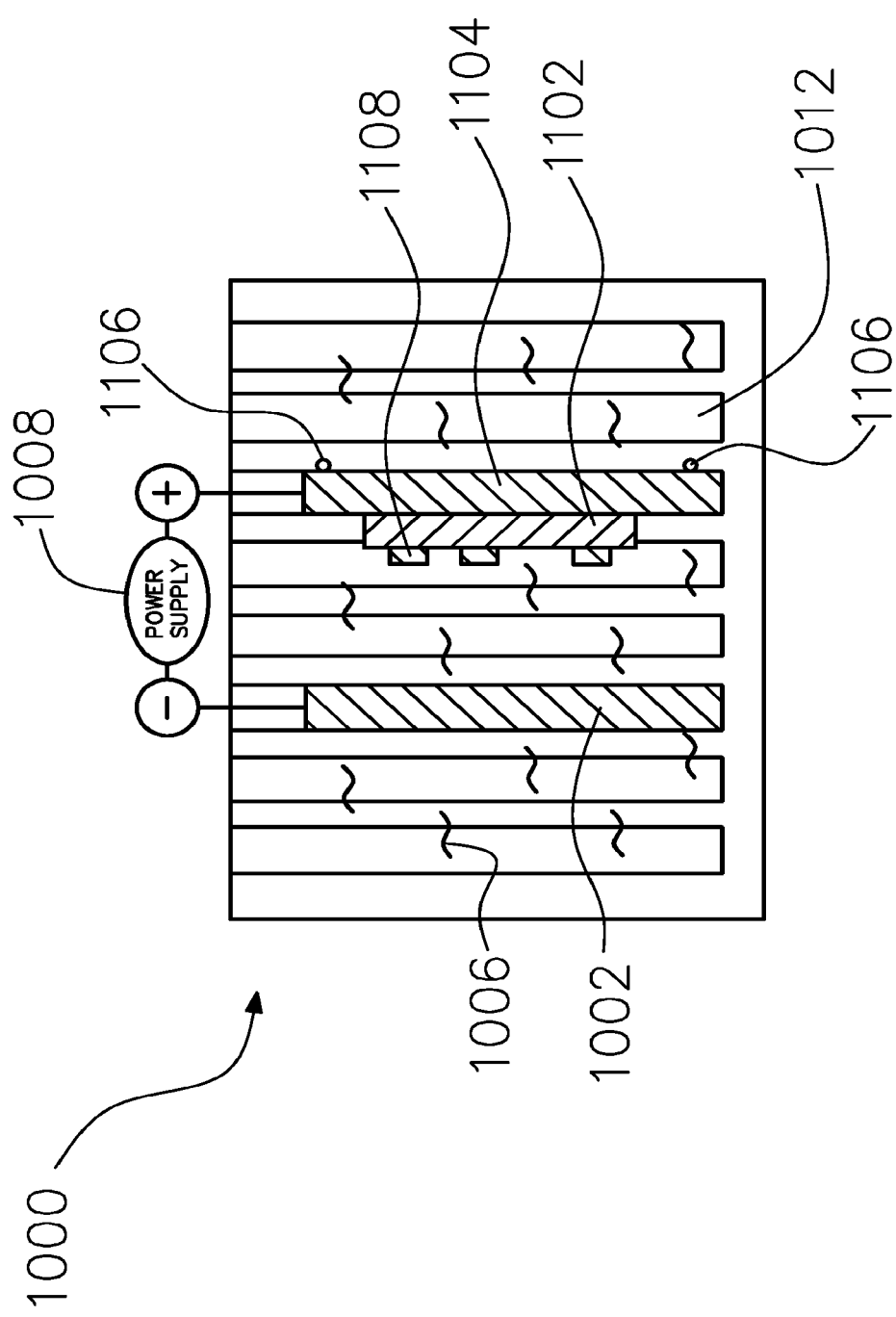
FIG. 11 depicts an example diagram showing a side view of the apparatus as shown in FIG. 10, in accordance with some embodiments.

FIG. 11 depicts an example diagram showing a side view of the apparatus as shown in FIG. 10, in accordance with some embodiments. As shown in FIG. 11, the anode electrode 1004 includes a wafer electrode 1102 and a conductive material 1104 (e.g., Pt, Ag, inert conductive materials, etc.), where the wafer electrode 1102 includes a semiconductor wafer (e.g., Si, GaAs, semiconductor-on-insulator, III-V materials, II-VI materials, etc.). One or more protruding structures 1108 are formed on the wafer electrode 1102 for nanowire formation.

Specifically, the electrolytic solution 1006 includes deionized water. For example, one or more chemicals may be included in the electrolytic solution 1006 to provide a suitable PH level and/or suitable ionic strength. The power supply 1008 includes a direct-current power supply with or without alternating-current components (e.g., 1 MHz). An insulator material 1106 includes a rubber, O-ring, or any other insulating material for support of the metal electrode 1104.

FIG. 12 depicts an example diagram showing an anode electrode as part of the apparatus as shown in FIG. 10, in accordance with some embodiments. As shown in FIG. 12, the conductive material 1104 (e.g., Pt, Ag, inert conductive materials, etc.) corresponds to a conductive holder that holds the wafer electrode 1102 so that the wafer electrode 1102 does not move around freely.

Specifically, the conductive material 1104 includes a top part 1202 and a bottom part 1204 for holding the wafer electrode 1102. The top part 1202 is in contact with part of a top surface of the wafer electrode 1102 and includes holes for clamping the wafer electrode 1102. The protruding structures 1108 are not in contact with the conductive material 1104. The bottom part 1204 is in contact with a bottom surface of the wafer electrode 1102.

In some embodiments, the wafer electrode 1102 is sandwiched between the top part 1202 and the bottom part 1204 of the conductive material 1104 through vacuum. The wafer electrode 1102 and the conductive material 1104 are electrically connected to the power supply 1008 through one or more wires attached to the conductive material 1104. The protruding structure 1108 has a width and a height, and an aspect ratio of the protruding structure 1108 is equal to the height divided by the width. In certain embodiments, the aspect ratio of the protruding structure 1108 is larger than an aspect-ratio threshold (e.g., 1).

FIG. 13 depicts another example diagram showing an anode electrode as part of the apparatus as shown in FIG. 10, in accordance with some embodiments. As shown in FIG. 13, the conductive material 1104 includes a conductive holder 1306 and a metal electrode 1308. The conductive holder 1306 holds both the wafer electrode 1102 and the metal electrode 1308.

Specifically, the conductive holder 1306 includes a top part 1302 and a bottom part 1304 for holding both the wafer electrode 1102 and the metal electrode 1308. The top part 1302 is in contact with part of a top surface of the wafer electrode 1102 and includes holes for clamping the wafer electrode 1102 and/or the metal electrode 1308. The protruding structures 1108 are not in contact with the conductive holder 1306. The bottom part 1304 is in contact with a bottom surface of the metal electrode 1308.

In some embodiments, the metal electrode 1308 includes Ag, Pt, inert conductive materials, etc. The wafer electrode 1102 and the metal electrode 1308 are sandwiched between the top part 1302 and the bottom part 1304 of the conductive holder 1306 through vacuum. The wafer electrode 1102, the metal electrode 1308, and the conductive holder 1306 are electrically connected to the power supply 1008 through one or more wires attached to the conductive holder 1306.

Figure 14:
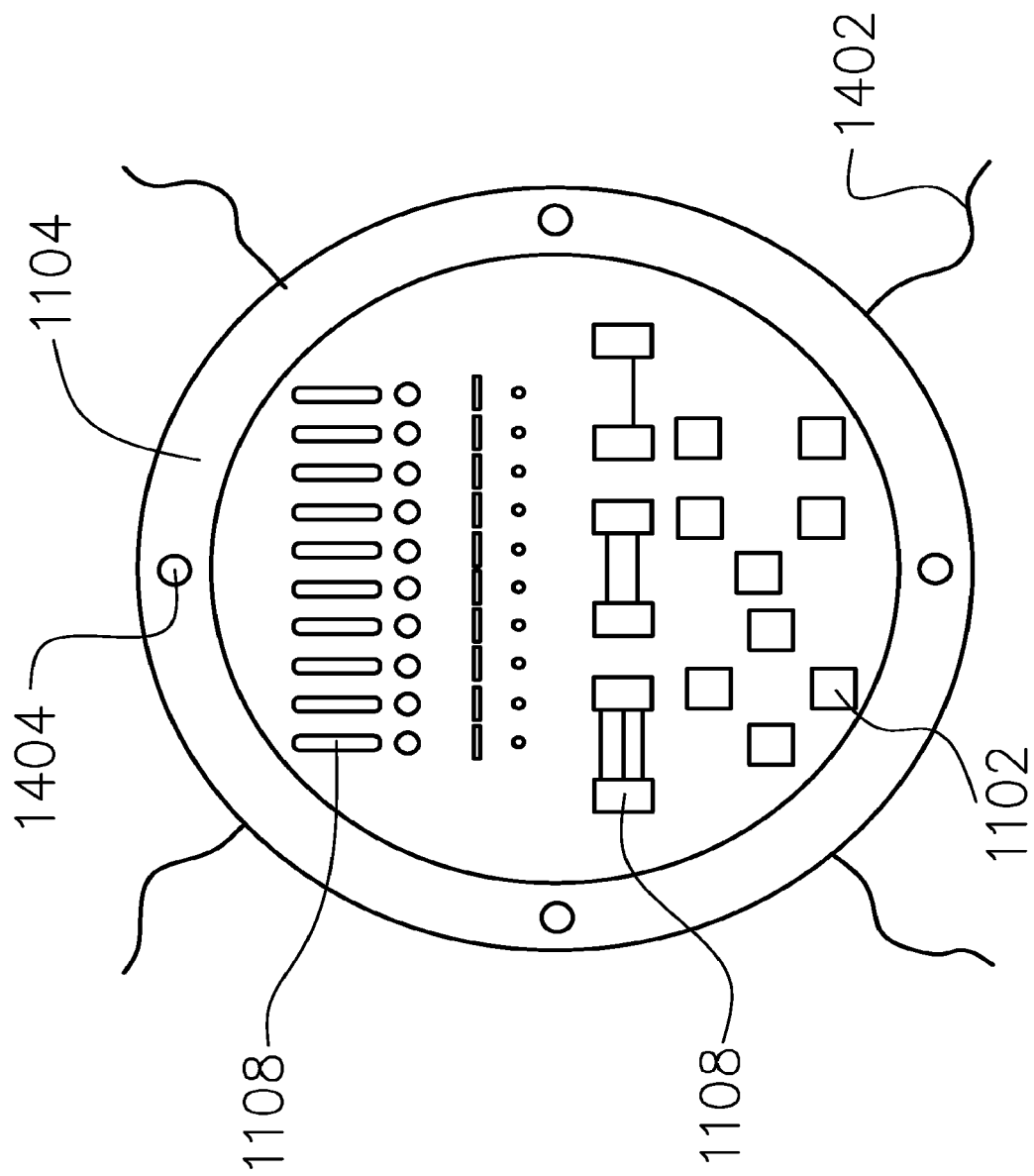
FIG. 14 depicts an example diagram showing protruding structures on a wafer electrode, in accordance with some embodiments.

FIG. 14 depicts an example diagram showing protruding structures on a wafer electrode, in accordance with some embodiments. As shown in FIG. 14, the protruding structures 1108 include nanowire-shaped structures, nanoslates, nanorods, nanostructures disposed between pads, or any other suitable nanostructures. The aspect ratios of the protruding structures 1108 are greater than a threshold (e.g., 1).

For example, a minimum feature width is in a range of about 10 nm to about 100 nm. The heights of the protruding structures 1108 are in a range of about 10 nm to about 500 nm, depending on the number of nanowires needed. The side walls of the protruding structures 1108 are of: vertical shapes, trapezoidal shapes, scalloped shapes, shapes of which a top width is larger than or equal to a bottom width, or any other suitable shapes. The conductive material 1104 (e.g., a top part) includes holes 1404 for clamping the wafer electrode 1102. The wafer electrode 1102 and the conductive material 1104 are electrically connected to the power supply 1008 through one or more wires 1402 attached to the conductive material 1104.

Figure 15:
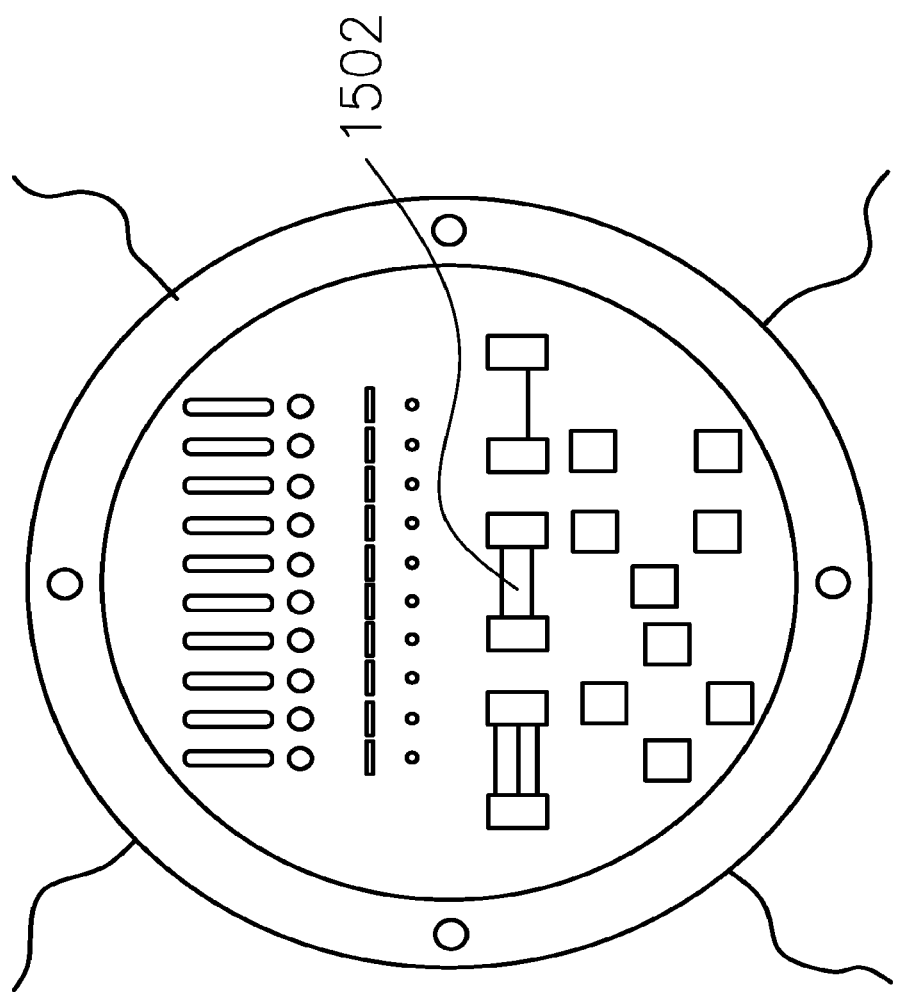
FIG. 15 depicts an example diagram showing patterns for forming protruding structures on a wafer electrode, in accordance with some embodiments.

FIG. 15 depicts an example diagram showing patterns for forming protruding structures on a wafer electrode, in accordance with some embodiments. As shown in FIG. 15, the patterns 1502 are used to form protruding structures (e.g., the structures 1108) on a substrate. In some embodiments, the patterns 1502 are formed using photoresist, oxides, silicon nitrides, or any other suitable materials.

A trench etching is performed using the patterns 1502 as etch masks to form the protruding structures (e.g., the structures 1108) with high aspect ratios. In certain embodiments, the trench etching includes repeated isotropic etching cycles, an anisotropic etching, or a combined isotropic/passivation cycles. The substrate including the protruding structures is then placed (e.g., immersed) in an electrolytic solution for anodic oxidation.

FIG. 16(A)-FIG. 16(C) depict example diagrams of an anodic oxidation process performed on a protruding structure showing charge distribution, and FIG. 17(A)-FIG. 17(C) depict example diagrams of an anodic oxidation process performed on a protruding structure without showing charge distribution, in accordance with some embodiments. A mask layer 1602 protects a top part of the protruding structure 1604. As shown in FIG. 16(A), at the beginning of the anodic oxidation process, positive charges distributes approximately uniformly across the protruding structure. An oxide layer is formed approximately uniformly from top to bottom of the protruding structure, as shown in FIG. 16(A) and FIG. 17(A). An electric field (e.g., $E_{top1}$) associated with a top part 1606 of the protruding structure 1604 is approximately equal to an electric field (e.g., $E_{bot1}$) associated with a bottom part 708 of the protruding structure 1604 in magnitude. The protruding structure 1604 is associated with a resistance $R_1$.

As shown in FIG. 16(B), further into the anodic oxidation process, the charge distribution changes as the oxide grows. The oxide grows more at the bottom part 708 than at the top part 1606, as shown in FIG. 16(B) and FIG. 17(B). An electric field (e.g., $E_{top2}$) associated with the top part 1606 becomes smaller than the electric field $E_{top1}$ in magnitude, while an electric field (e.g., $E_{bot2}$) associated with the bottom part 1608 is approximately equal to the electric field $E_{bot1}$ in magnitude. A resistance $R_2$ associated with the protruding structure 1604 at this stage is larger than the resistance $R_1$.

At the end of the anodic oxidation process, the oxide further grows at the bottom part of the protruding structure 1604 until a conduction channel of charges to the top part of the protruding structure 1604 is closed off, as shown in FIG. 16(C) and FIG. 17(C). An electric field (e.g., $E_{top3}$) associated with the top part decreases to a small magnitude (e.g., zero), and an electric field (e.g., $E_{bot3}$) associated with the bottom part also becomes approximately zero. Once the conduction channel of charges to the top part is sealed off, the oxide stops growing at the top part. The un-oxidized semiconductor material (e.g., Si, GaAs, semiconductor-on-insulator, III-V materials, II-VI materials, etc.) at the top part of the protruding structure 1604 forms a nanowire.

FIG. 18(A)-FIG. 18(D) depict example diagrams showing anodic oxidation performed on different wafer electrodes, in accordance with some embodiments. Different wafer electrodes include protruding structures of different widths respectively. As shown in FIG. 18(A)-18(D), under approximately same conditions for anodic oxidation (e.g., duration of oxidation), nanowires are formed for the protruding structures with a width of 60 nm, where oxides surround the formed nanowires. For the protruding structures with widths of 70 nm, 80 nm, and 90 nm, oxides did not grow farther enough to enclose parts of the semiconductor material to form nanowires. It indicates that under certain conditions for anodic oxidation (e.g., duration of oxidation), nanowires can be formed for a protruding structure with a width no larger than a width threshold.

FIG. 19(A) depicts an example diagram showing a pattern of a protruding structure on a wafer electrode, and FIG. 19(B) depicts an example diagram showing a cross-section view of the pattern along a cutline AA', in accordance with some embodiments. As shown in FIG. 19(A), the protruding structure 1902 is patterned on a wafer electrode 1904 that includes a substrate (e.g., Si, GaAs, semiconductor-on-insulator, III-V materials, II-VI materials, etc.). For example, the patterning of the protruding structure 1902 is performed through e-beam lithography and etching. In another example, the patterning of the protruding structure 1902 is performed through extreme ultraviolet lithography, resist trimming, and etching. In yet another example, the patterning of the protruding structure 1902 is performed through a nano-patterning process, e.g., charged-ion-beam (CIB). As shown in FIG. 19(B), different profiles of the protruding structure 1902 can be formed. The aspect ratio of the protruding structure 1902 exceeds an aspect ratio threshold (e.g., 1). In some embodiments, a mask 1906 is formed through lithography, or formed during a subsequent anodic oxidation process.

Figure 20:
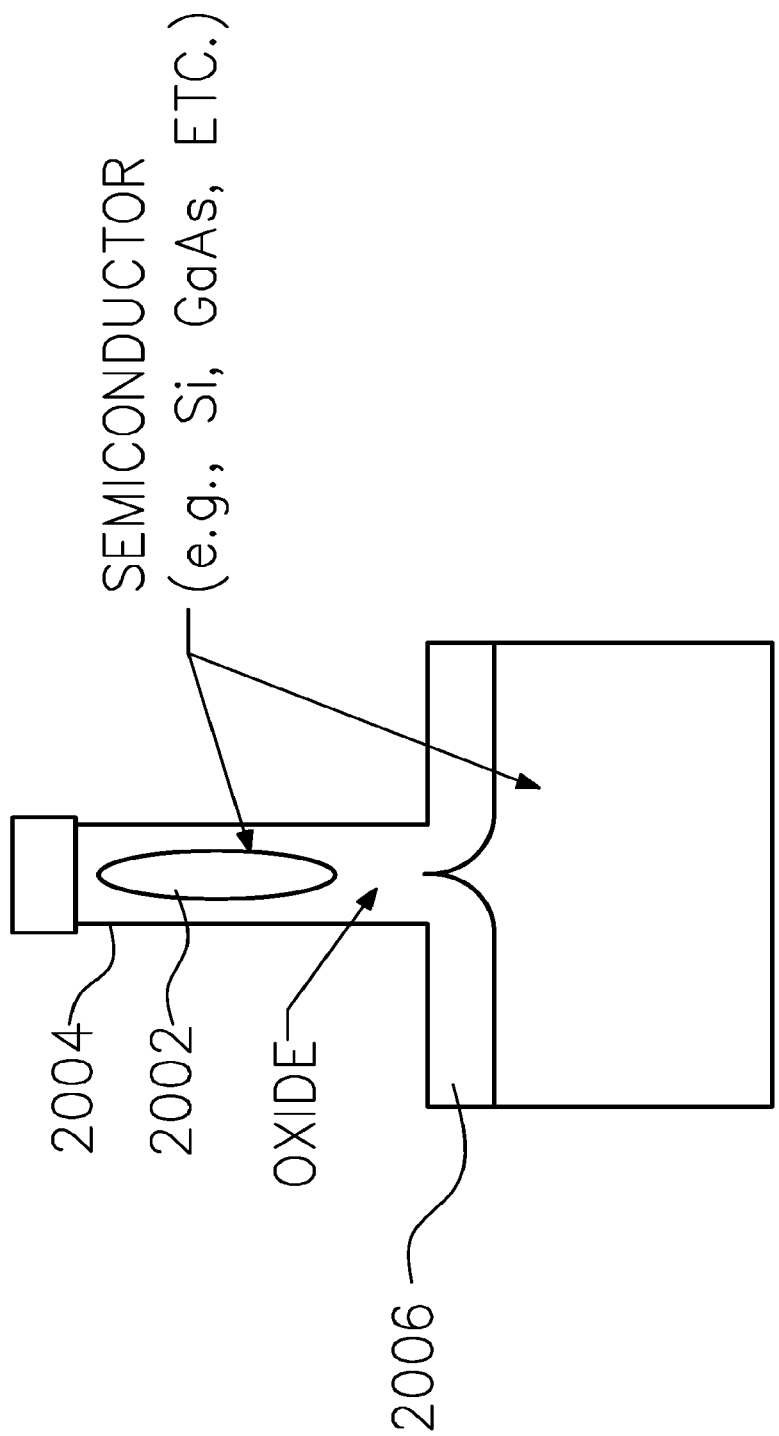
FIG. 20 depicts an example diagram showing a cross-section view of a wafer electrode including a protruding structure after anodic oxidation, in accordance with some embodiments.

FIG. 20 depicts an example diagram showing a cross-section view of a wafer electrode including a protruding structure after anodic oxidation, in accordance with some embodiments. As shown in FIG. 20, a nanowire 2002 is formed in the protruding structure 2004 and is surrounded by the anodic oxide 2006 formed during the anodic oxidation.

Specifically, non-uniform electric field (e.g., due to electric field self-distribution as shown in FIG. 16(A)-FIG. 16(C)) in the protruding structure 2004 during the anodic oxidation causes non-uniform formation of the oxide 1106. For example, a width of a top part of the protruding structure 2004 is larger than or equal to a width of a bottom part of the protruding structure 2004. The anodic oxidation of the top part of the protruding structure 2004 ends when the oxidation of the bottom part of the protruding structure 2004 closes off a conduction channel of charges to the top part. In some embodiments, the protruding structure 2004 may undergo alternation of anodic oxidation and etching, so that nanowires with small sizes (e.g., 5-7 nm) covered with a dielectric material (e.g., oxides) can be formed.

FIG. 21(A) and FIG. 21(B) depict example diagrams showing formation of multiple nanowires through anodic oxidation, in accordance with some embodiments. As shown in FIG. 21(A), a protruding structure 2102 formed on a substrate 2104 undergoes multiple (e.g., two) etching and passivation cycles to form multiple (e.g., two) undercut features (e.g., scalloped shapes). Anodic oxidation is performed on the substrate 2104 with the protruding structure 2102.

Multiple nanowires can be formed in the protruding structure 2102, and a dielectric material 2112 (e.g., oxides) surrounds the nanowires. In some embodiments, diameters of the nanowires become smaller from top to bottom of the protruding structure 2102. In certain embodiments, the diameters of the nanowires are approximately equal with properly designed processes (e.g., etching cycles).

As shown in FIG. 21(B), the nanowire 2106 is formed first in a top part of the protruding structure 2102, and the nanowire 2108 is then formed in a bottom part of the protruding structure 2102. One or more nano-vias 2110 are also formed during the anodic oxidation. In some embodiments, the nanowire 2106 has a diameter smaller than 9 nm. In certain embodiments, the nanowire 2108 has a smaller diameter than the nanowire 2106. In some embodiments, the diameters of the nanowires 2108 and 2106 are approximately equal.

FIG. 22(A)-FIG. 22(C) depict other example diagrams showing formation of multiple nanowires through anodic oxidation, in accordance with some embodiments. As shown in FIG. 22(A), a protruding structure 2202 formed on a substrate 2204 undergoes multiple (e.g., two) etching and passivation cycles to form multiple (e.g., two) undercut features (e.g., scalloped shapes). A first anodic oxidation process is performed on the substrate 2204 with the protruding structure 2202.

As shown in FIG. 22(B), the protruding structure 2202 is partially oxidized to form an original oxide 2206 (e.g., $SiO_2$) through the first anodic oxidation process. One or more metal materials 2208 (e.g., Hf, Al, etc.) are formed on the original oxide 2206, e.g., through atomic layer deposition (ALD), chemical vapor deposition (CVD), plasma-enhanced atomic layer deposition (PEALD), etc. A second anodic oxidation process is performed on the substrate 2204 with the protruding structure 2202. The metal materials 2208 are converted to a high-k dielectric material (e.g., metal oxides) that is formed on the original oxide 2206.

As shown in FIG. 22(C), at the end of the second anodic oxidation process, nanowires 2210 and 2212 and/or nano-channels 2214 are formed and surrounded by the oxide 2218 (e.g., $SiO_2$) and the high-k dielectric material 2216. For example, the effective dielectric constant of the mixture of the high-k dielectric material 2216 and the oxide 2218 is larger than that of the oxide 2218. In some embodiments, the diameters of the nanowires 2210 and 2212 are approximately equal and smaller than 9 nm. In certain embodiments, the diameter of the nanowires 2210 is larger than the diameter of the nanowire 2212. The substrate 2204 includes a ridge section 2220 extending under the protruding structure 2202. For example, the ridge section 2220 extends along a same direction as the nanowires 2210 and 2212.

FIG. 23(A)-FIG. 23(C) depict other example diagrams showing formation of multiple nanowires through anodic oxidation, in accordance with some embodiments. As shown in FIG. 23(A), a protruding structure 2302 formed on a substrate 2304 undergoes multiple (e.g., two) etching and passivation cycles to form multiple (e.g., two) undercut features (e.g., scalloped shapes).

As shown in FIG. 23(B), one or more metal materials 2306 (e.g., Hf, Al, etc.) are formed on the protruding structure 2302, e.g., through ALD, CVD, PEALD, etc. An anodic oxidation process is performed on the substrate 2304 with the protruding structure 2302 and the metal materials 2306. The metal materials 2306 are converted to a high-k dielectric material (e.g., metal oxides).

As shown in FIG. 23(C), at the end of the anodic oxidation process, nanowires 2310 and 2312 and/or nano-vias 2314 are formed and surrounded by a mixture 2308 of the high-k dielectric material and the anodic oxide (e.g., $SiO_2$). For example, the effective dielectric constant of the mixture of the high-k dielectric material and the anodic oxide is larger than that of the anodic oxide. In some embodiments, the diameters of the nanowires 2310 and 2312 are approximately equal and smaller than 9 nm. In certain embodiments, the diameter of the nanowires 2310 is larger than the diameter of the nanowire 2312. The substrate 1404 includes a ridge section 2316 extending under the protruding structure 2302. For example, the ridge section 2316 extends along a same direction as the nanowires 2310 and 2312.

Figure 24:
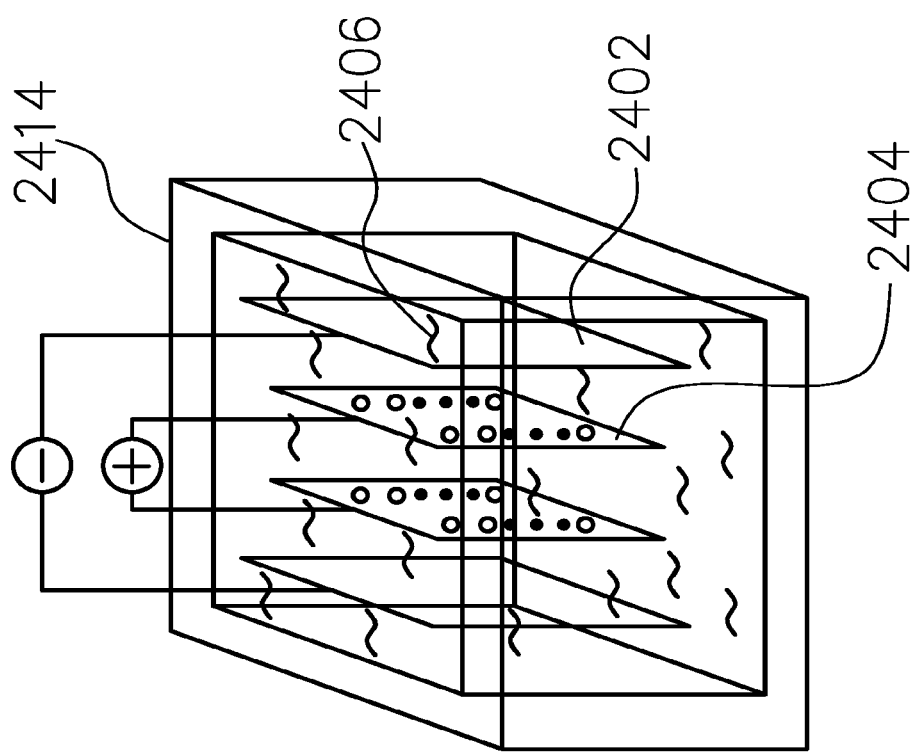
FIG. 24 depicts an example diagram showing anodic oxidation for multiple wafer electrodes, in accordance with some embodiments.

FIG. 24 depicts an example diagram showing anodic oxidation for multiple wafer electrodes, in accordance with some embodiments. As shown in FIG. 24, multiple cathode electrodes 2402 including metal materials (e.g., Ag, Pt, etc.) and multiple anode electrode 2404 including a semiconductor wafer (e.g., Si, GaAs, semiconductor-on-insulator, III-V materials, II-VI materials, etc.) are immersed in an electrolytic solution 2406 which is contained in a tank 2414 for anodic oxidation. The cathode electrodes 2402 and the anode electrodes 2404 are connected electrically to one or more power supplies (not shown).

Figure 25:
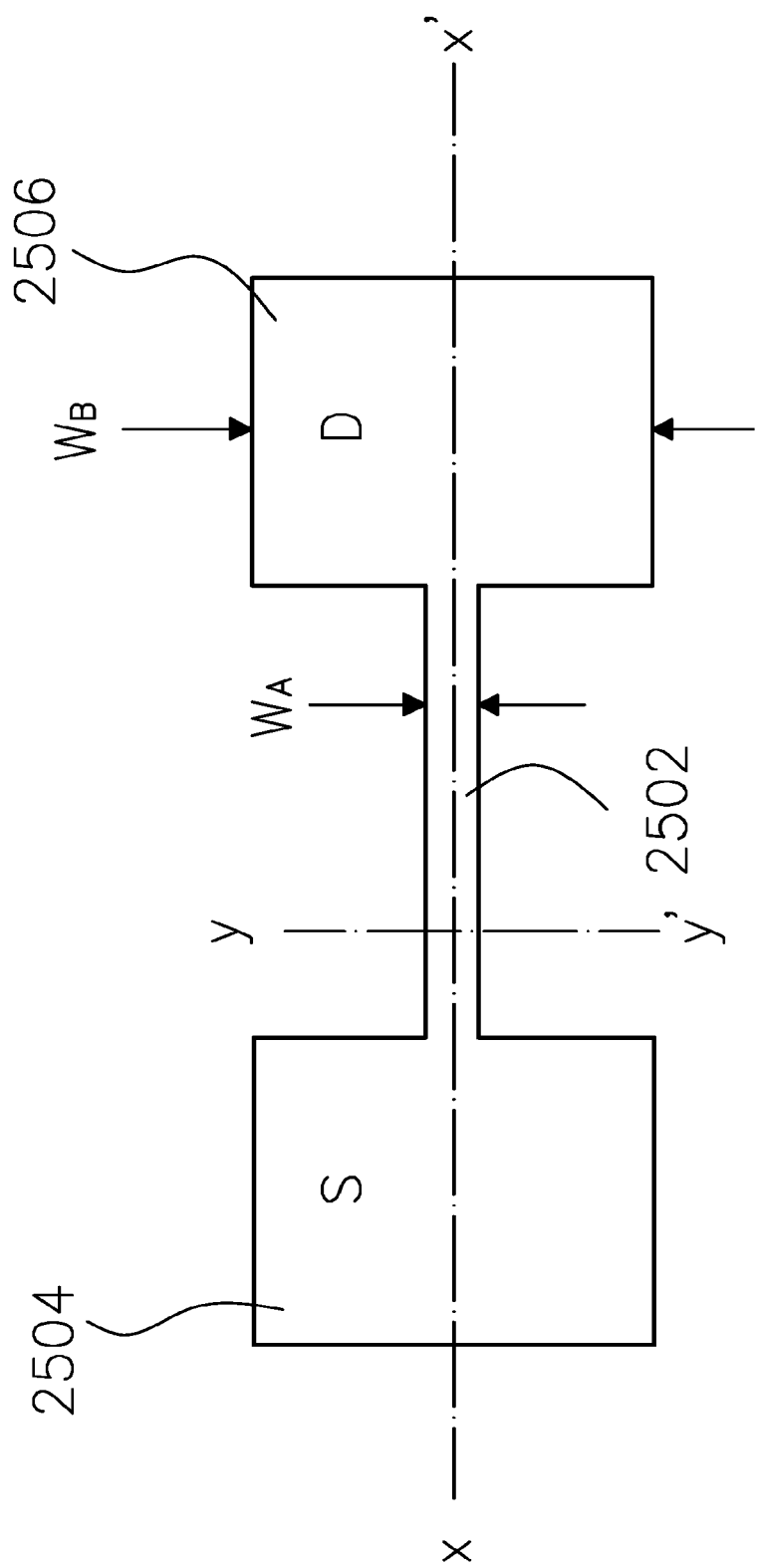
FIG. 25 depicts an example diagram showing a top view of an original mask for forming a protruding structure for a transistor structure, in accordance with some embodiments.

The nanowires formed through anodic oxidation as described above can be used for fabricating nanowire devices. FIG. 25 depicts an example diagram showing a top view of an original mask for forming a protruding structure for a transistor structure, in accordance with some embodiments. As shown in FIG. 25, the protruding structure 2502 can be disposed between a source region 2504 and a drain region 2506. For example, the patterning of the protruding structure 2502 is performed through e-beam lithography and etching. In another example, the patterning of the protruding structure 2502 is performed through extreme ultraviolet lithograph, resist trimming, and etching. In yet another example, the patterning of the protruding structure 2502 is performed through a nano-patterning process, e.g., charged-ion-beam (CIB).

Figure 26A:
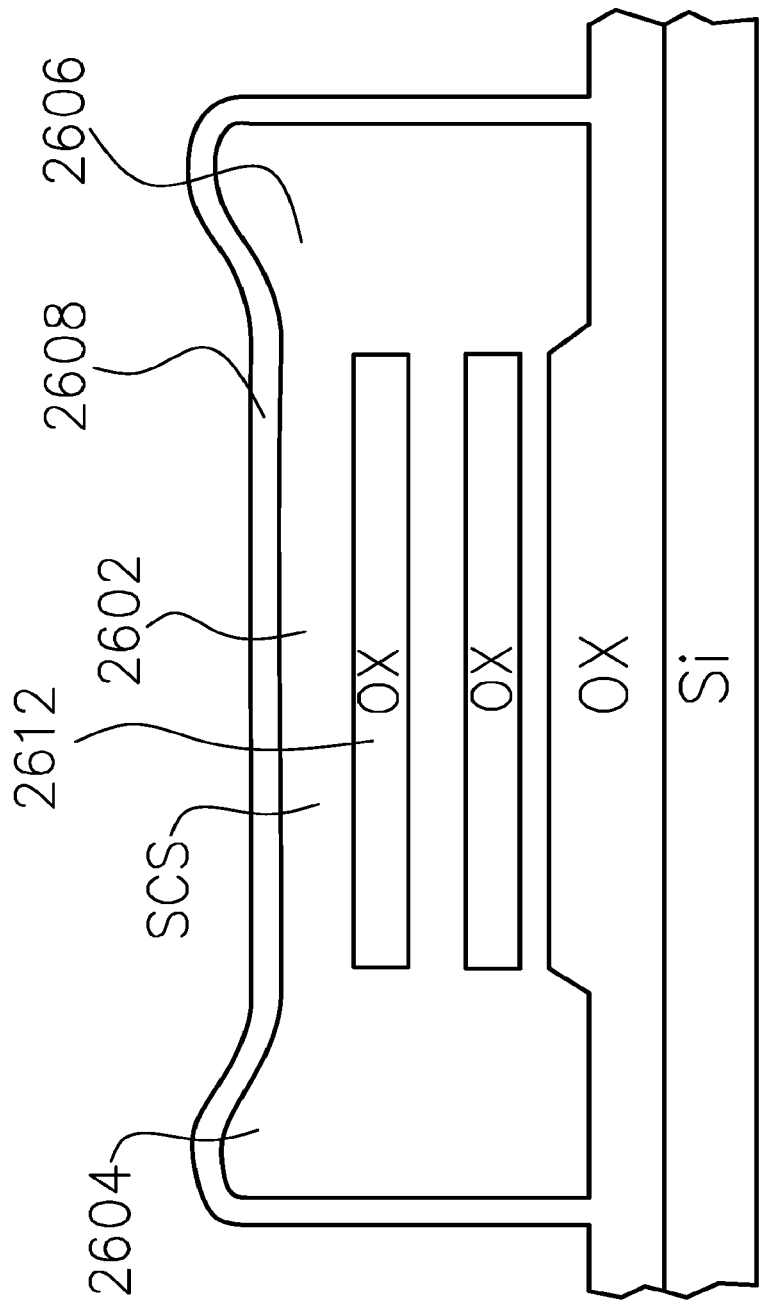
FIG. 26(A)-FIG. 26(C) depict example diagrams showing cross-section views along different cutlines respectively, in accordance with some embodiments.
Figure 26B:
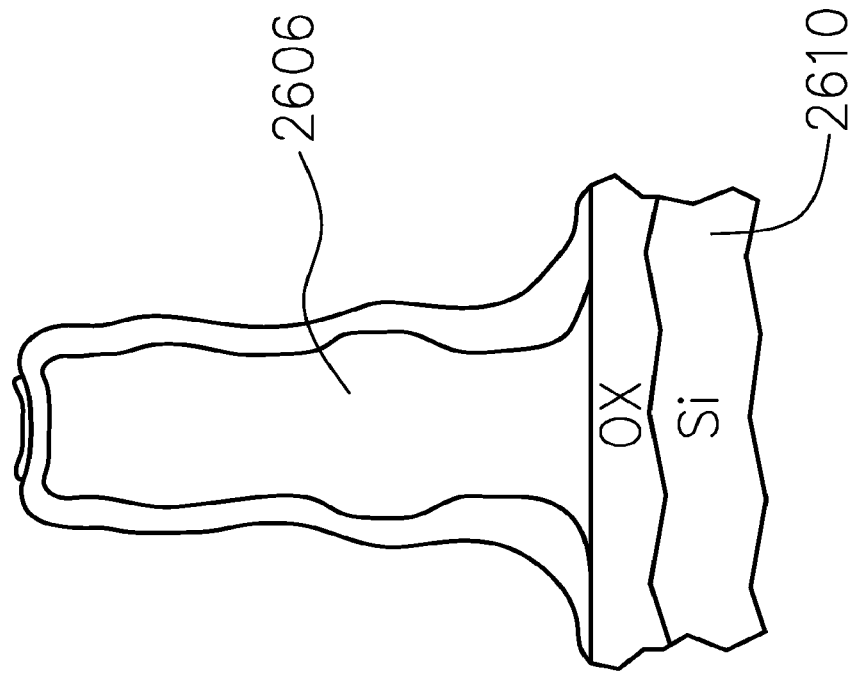
Figure 26C:
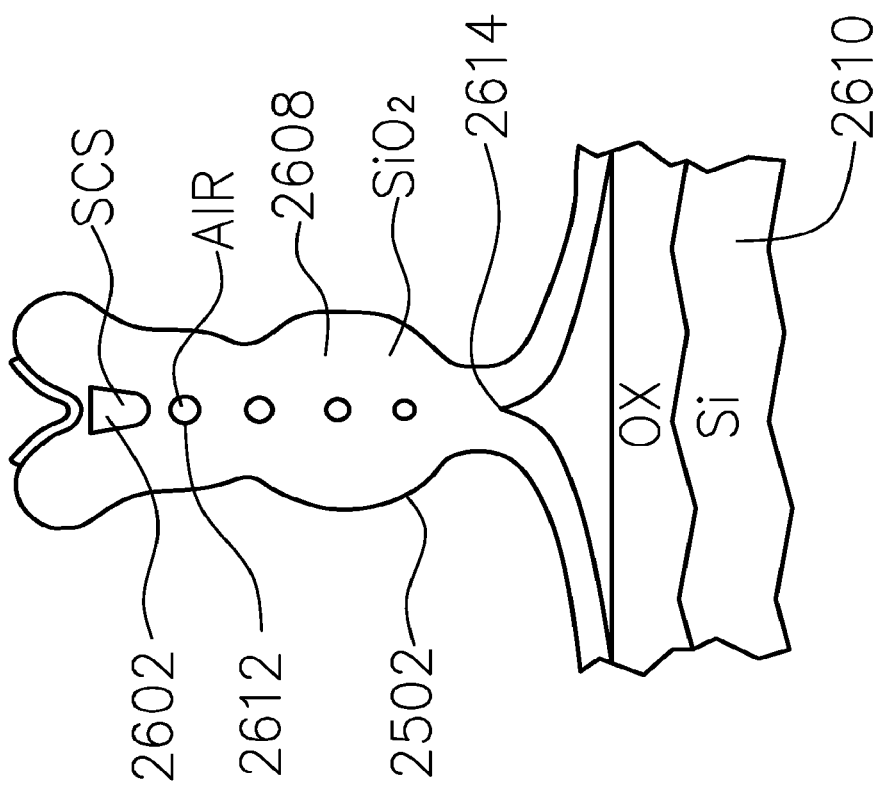

Anodic oxidation is performed to form one or more nanowires in the protruding structure 2502. Cross-section views along a cutline xx', a cutline yy' at $W_A$, and the cutline yy' at $W_B$ are shown in FIG. 26(A), FIG. 26(B) and FIG. 26(C), respectively. As shown in FIG. 26(A) and FIG. 26(B), the nanowires 2602 are formed between a source structure 2604 and a drain structure 2606 and surrounded by a dielectric material 2608 (e.g., oxides) that is formed during the anodic oxidation. Nano-vias 2612 (e.g., filled with air or solids) are formed as well. The substrate 2610 includes a semiconductor-on-insulator wafer, silicon, III-V materials, II-VI materials, etc. A cross-section view of the drain structure 2606 is shown in FIG. 26(C). The drain structure 2606 is continuous to the substrate 2610, or isolated from the substrate 2610 (e.g., through suitable design of anodic oxidation). A ridge section 2614 extends under the protruding structure 2502 and along a same direction as the nanowires 2602.

Figure 27A:
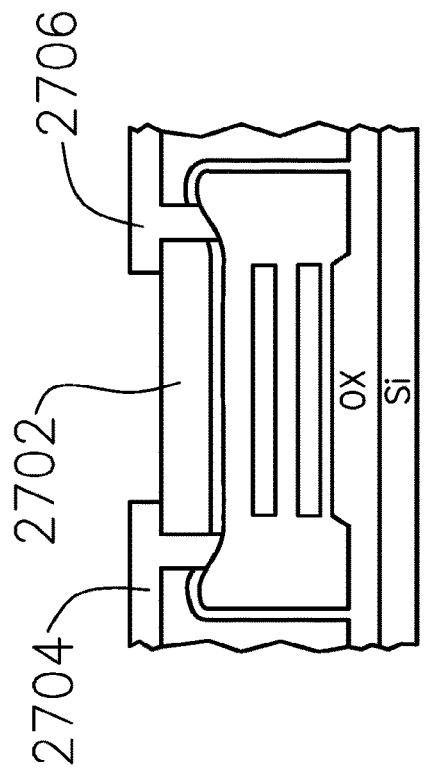
FIG. 27(A)-FIG. 27(D) depict example diagrams showing a process for fabricating a transistor structure using nanowires formed through anodic oxidation, in accordance with some embodiments.
Figure 27B:
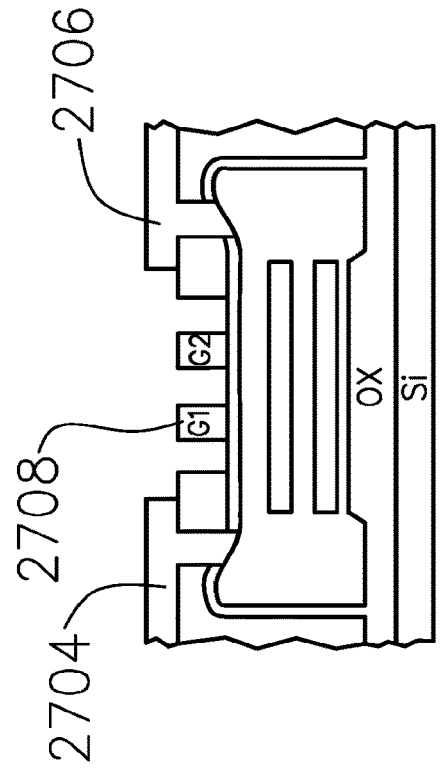
Figure 27C:
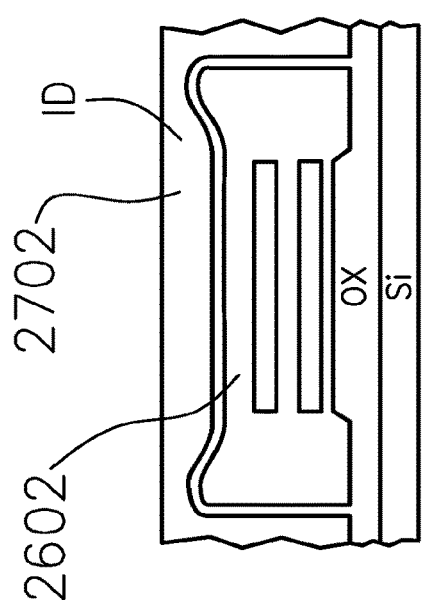
Figure 27D:
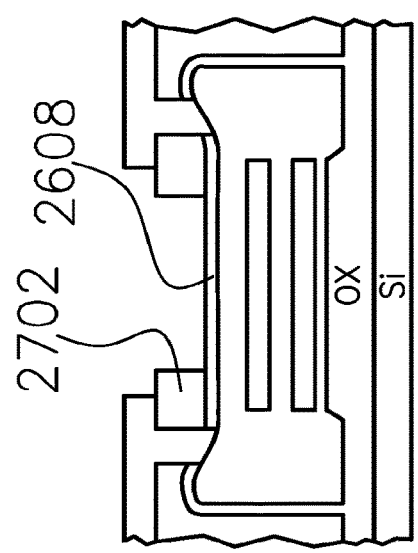

FIG. 27(A)-FIG. 27(D) depict example diagrams showing a process for fabricating a transistor structure using nanowires formed through anodic oxidation, in accordance with some embodiments. As shown in FIG. 27(A), an interlayer dielectric (ILD) layer 2702 is formed on the wafer. Lithography and etching are performed to open source/drain contact areas, and interconnect metallization is carried out to form source/drain contacts 2704 and 2706, as shown in FIG. 27(B). Lithography is performed to pattern gate contact areas, and a selective etching is performed to remove part of the ILD layer 2702, but not the dielectric material 2608, as shown in FIG. 27(C). CIB (e.g., He/Ne beam) is performed to form multiple metal nanogate lines 2708 to form a transistor structure, as shown in FIG. 27(D).

Figures 28A, 28B, 28C, 28D:
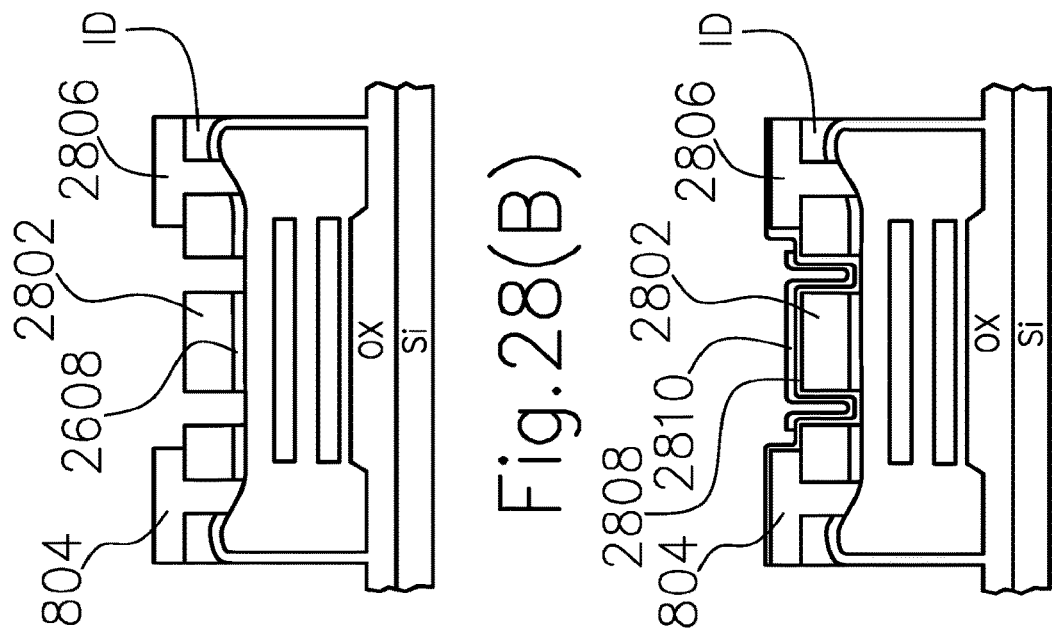
FIG. 28(A)-FIG. 28(D) depict other example diagrams showing a process for fabricating a transistor structure using nanowires formed through anodic oxidation, in accordance with some embodiments.

FIG. 28(A)-FIG. 28(D) depict other example diagrams showing a process for fabricating a transistor structure using nanowires formed through anodic oxidation, in accordance with some embodiments. As shown in FIG. 28(A), an interlayer dielectric (ILD) layer 2802 is formed on the wafer. Lithography is performed to pattern source/drain contact areas and gate contact areas, and etching is performed to the ILD layer 2802 and the oxide 2608 in the source/drain contact areas and the gate contact areas. Interconnect metallization is carried out to form source/drain contacts 2804 and 2806, as shown in FIG. 28(B). A dielectric material 2808 (e.g., a high-k material) is formed (e.g., through CVD, ALD, PEALD, etc.) on the wafer, as shown in FIG. 28(C). The formation of the dielectric material 2808 also shrinks a gap size for nanogate formation (e.g., a trench refill process). In some embodiments, a conductive material 2810 (e.g., metal-containing materials) is formed (e.g., through CVD, ALD, PEALD, etc.) on the wafer to form nanogates, as shown in FIG. 28(D). In certain embodiments, CIB (e.g., He/Ne beam) is performed to form multiple metal nanogate lines. Finally, the dielectric material 2808 on top of the source/drain regions are removed.

Figure 29:
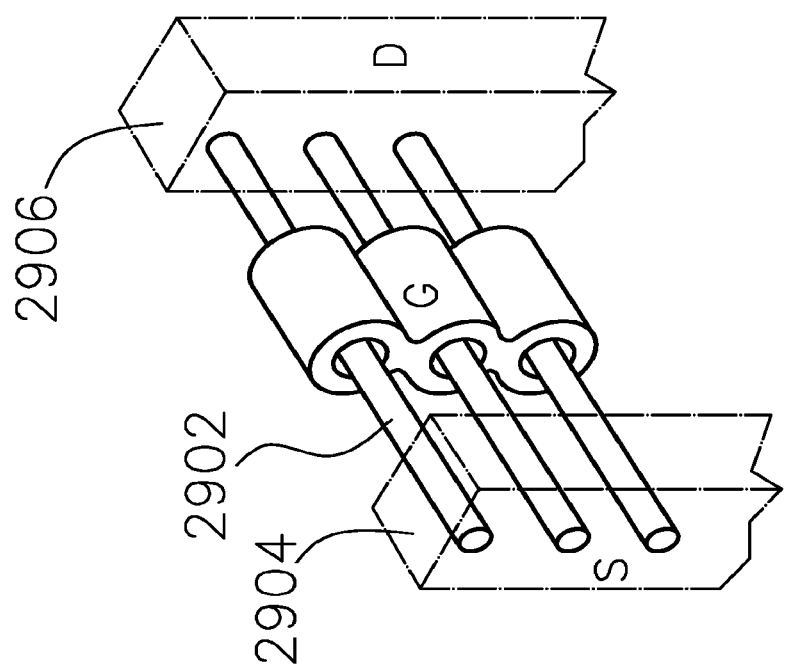
FIG. 29 depicts an example diagram showing a nanowire device, in accordance with some embodiments.

FIG. 29 depicts an example diagram showing a nanowire device, in accordance with some embodiments. As shown in FIG. 29, a stack of nanowires 2902 are fabricated using anodic oxidation as described above. In some embodiments, anodic oxides surrounding the nanowires 2902 are partially removed to physically isolate the nanowires 2902. In certain embodiments, the anodic oxides that surround the nanowires 2902 are completely removed to expose the nanowires 2902. Dielectric materials (e.g., high-k materials) are formed on the nanowires 2902, and CIB is performed to form a single metal nanogate line or multiple metal nanogate lines. Source/drain contacts 2904 and 2906 are formed through lithography, etching and contact formation. A gate-all-around transistor using multiple nanowires is formed.

Figure 30:
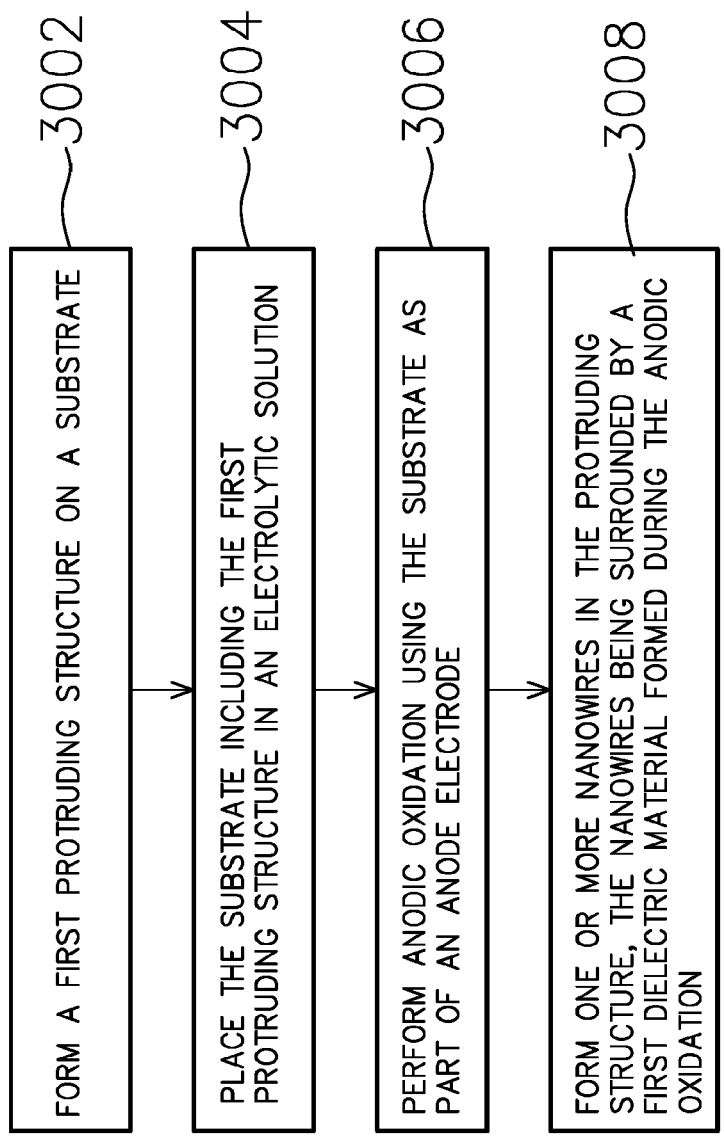
FIG. 30 depicts an example flow chart for forming nanowires, in accordance with some embodiments.

FIG. 30 depicts an example flow chart for forming nanowires, in accordance with some embodiments. At 3002, a first protruding structure is formed on a substrate. At 300, the first protruding structure is placed in an electrolytic solution. At 3006, anodic oxidation is performed using the substrate as part of an anode electrode. At 3008, one or more nanowires are formed in the protruding structure. The nanowires are surrounded by a first dielectric material formed during the anodic oxidation.

The present disclosure describes formation of nanowires for device fabrication using anodic oxidation. In some embodiments, the devices, structures and methods described herein are configured to fabricate vertically self-aligned nanowires.

According to one embodiment, a method is provided for forming nanowires on a substrate. A first protruding structure is formed on a substrate. The first protruding structure is placed in an electrolytic solution. Anodic oxidation is performed using the substrate as part of an anode electrode. One or more nanowires are formed in the protruding structure. The nanowires are surrounded by a first dielectric material formed during the anodic oxidation.

According to another embodiment, a structure includes: a substrate, a protruding structure formed on the substrate, and one or more nanowires formed in the protruding structure. The substrate includes a ridge section extending under the protruding structure.

According to yet another embodiment, a device includes: a source region, a drain region, and a gate structure. The source region is formed on a substrate, and the drain region is formed on a substrate. The gate structure includes one or more nanowires disposed between the source region and the drain region. The substrate includes a ridge section extending under the nanowires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a first protrusion over a substrate;
    performing one or more iterations of anodic oxidation on the first protrusion, wherein after the performing the one or more iterations of anodic oxidation, the first protrusion comprises a first dielectric material surrounding a nanowire, the first dielectric material comprising a tapered recess at a top surface thereof, wherein a depth of the tapered recess measured in a first direction is greater at a center of the first dielectric material than a depth of the tapered recess measured in the first direction at edges of the first dielectric material; and
    forming a gate over the tapered recess, wherein the first dielectric material comprises an antifuse extending between the nanowire and the gate.

2. The method of claim 1, wherein after the performing the one or more iterations of anodic oxidation, the first protrusion has a first width in a top portion of the first protrusion, the first protrusion has a second width in a bottom portion of the first protrusion disclosed closer to the substrate than the top portion, and the first width is greater than the second width.

3. The method of claim 1, wherein forming the gate comprises depositing a conductive material over the first dielectric material, and etching the conductive material to form the gate.

4. The method of claim 1, further comprising etching the first dielectric material to form a first recess exposing the nanowire, and depositing a conductive material in the first recess and electrically coupled with the nanowire.

5. The method of claim 1, wherein forming the gate forms a plurality of gates, wherein the first dielectric material comprises a plurality of antifuses, and wherein each of the antifuses of the plurality of antifuses extends between the nanowire and a respective gate of the plurality of gates.

6. The method of claim 1, wherein the first protrusion comprises a semiconductor material prior to the performing the one or more iterations of anodic oxidation on the first protrusion, wherein the first dielectric material comprises an oxide of the semiconductor material.

7. The method of claim 1, wherein the first protrusion comprises a metal prior to the performing the one or more iterations of anodic oxidation on the first protrusion, wherein the first dielectric material comprises an oxide of the metal.

8. The method of claim 1, wherein the gate is formed having a longitudinal axis perpendicular to a longitudinal axis of the nanowire.

9. A method comprising:
    forming a protrusion on a substrate;
    forming a first dielectric material surrounding a nanowire in the protrusion, wherein the forming the first dielectric material comprises oxidizing the protrusion, wherein the first dielectric material is a single, continuous material, and wherein a width of a top portion of the protrusion distal the substrate in a direction parallel to a major surface of the substrate is greater than a width of a bottom portion of the protrusion proximal the substrate in the direction parallel to the major surface of the substrate;
    etching the first dielectric material to expose the nanowire;
    depositing a conductive layer over the first dielectric material, wherein the conductive layer extends to make contact with the nanowire; and
    etching the conductive layer to form at least one program line, wherein the first dielectric material comprises an antifuse interposed between the program line and the nanowire.

10. The method of claim 9, wherein the etching the conductive layer forms a plurality of program lines comprising the at least one program line.

11. The method of claim 9, wherein the oxidizing the protrusion comprises applying a non-uniform electric field to the protrusion to cause non-uniform anodic oxidation of the protrusion.

12. The method of claim 9, wherein after the forming the first dielectric material, a first height of the first dielectric material at edges of the first dielectric material in a first direction perpendicular to the major surface of the substrate is greater than a second height of the first dielectric material at a center of the first dielectric material in the first direction, the first height and the second height being measured between the major surface of the substrate and top surfaces of the first dielectric material.

13. The method of claim 9, wherein the depositing the conductive layer comprises depositing a metal using a charged-ion beam.

14. The method of claim 9, wherein the forming the first dielectric material surrounding the nanowire forms the antifuse of a material having a dielectric strength from 10 MV/m to 1000 MV/m.

15. A method comprising:
patterning a protrusion over a substrate;
anodically oxidizing the protrusion to form a select line surrounded by a dielectric material, the dielectric material comprising an antifuse disposed over the select line in a direction perpendicular to a major surface of the substrate, the dielectric material comprising a single, continuous material in contact with a top surface, a bottom surface, and side surfaces of the select line;
etching the dielectric material to expose at least a portion of the select line; and
depositing a conductive material over the dielectric material, the conductive material being electrically coupled to the select line.

16. The method of claim 15, further comprising etching the conductive material to form a program line, the program line being disposed over the antifuse in the direction perpendicular to the major surface of the substrate, the program line being discontinuous with a remainder of the conductive material.

17. The method of claim 15, wherein the patterning the protrusion forms two terminal portions of the protrusion having first widths in a direction parallel with the major surface of the substrate and a central portion of the protrusion extending between the two terminal portions of the protrusion, the central portion of the protrusion having a second width in the direction parallel with the major surface of the substrate, the second width being less than the first widths.

18. The method of claim 17, wherein the etching the dielectric material exposes portions of the select line in the two terminal portions of the protrusion, the exposed portions of the select line comprising a source and a drain.

19. The method of claim 15, wherein after the anodically oxidizing the protrusion, the protrusion has a first height measured in a first direction perpendicular to the major surface of the substrate at edges of the protrusion and a second height measured in the first direction perpendicular to the major surface of the substrate at a center of the protrusion, the second height being less than the first height, the first height and the second height being measured between the major surface of the substrate and top surfaces of the protrusion.

20. The method of claim 9, wherein the etching the conductive layer forms a plurality of program lines comprising the at least one program line, wherein the first dielectric material comprises an antifuse array comprising the antifuse, and wherein respective antifuses of the antifuse array are interposed between respective program lines of the plurality of program lines and the nanowire.

* * * * *